United States Patent [19]

Bult et al.

[11] Patent Number: 5,475,331

[45] Date of Patent: Dec. 12, 1995

[54] CURRENT DIVIDER AND INTEGRATED CIRCUIT HAVING A PLURALITY OF CURRENT DIVIDERS

[75] Inventors: Klaas Bult; Godefridus J. G. M. Geelen, both of Eindhoven, Netherlands

[73] Assignee: U.S. Philips Corporation, New York, N.Y.

[21] Appl. No.: 15,190

[22] Filed: Feb. 10, 1993

[30] Foreign Application Priority Data

Feb. 11, 1992 [EP] European Pat. Off. ............... 92200381

[51] Int. Cl.$^6$ ..................... H03K 17/62; H03K 17/687
[52] U.S. Cl. ..................... 327/427; 327/434; 327/404
[58] Field of Search ..................... 307/304, 244, 307/571, 584, 448, 451, 468, 469, 290; 328/62, 105, 104; 327/564, 565, 566, 427, 434, 436, 403, 404, 407, 408, 530; 326/112, 119, 44

[56] References Cited

U.S. PATENT DOCUMENTS

| | | | |
|---|---|---|---|
| 4,197,511 | 4/1980 | Sequin et al. | 330/293 |
| 4,415,883 | 11/1983 | von Sichart | 340/347 |
| 4,833,342 | 5/1989 | Kiryu et al. | 307/304 |
| 4,890,011 | 12/1989 | Miyatake | 307/304 |
| 4,897,563 | 1/1990 | Bahl | 307/244 |
| 4,939,394 | 7/1990 | Hashimoto | 307/290 |
| 4,978,905 | 12/1990 | Hoff et al. | 307/304 |
| 5,034,623 | 7/1991 | McAdams | 307/290 |
| 5,175,445 | 12/1992 | Kinugasa et al. | 307/290 |

FOREIGN PATENT DOCUMENTS

0031583  6/1981  European Pat. Off. .

Primary Examiner—Timothy P. Callahan
Assistant Examiner—Toan Tran
Attorney, Agent, or Firm—Steven R. Biren

[57] ABSTRACT

A current divider for linearly dividing a first signal current (Ii10) into a second and a third signal current (Io11, Io12) includes a first terminal (I10) for the passage of the first signal current (Ii10), a second terminal (O11) for the passage of the second signal current (Io11) and for receiving a first potential, a third terminal (O12) for the passage of the third signal current (Io12) and for receiving a second potential, a first MOS transistor (M1) having a control electrode and a main current path, and a second MOS transistor (M2) having a control electrode and a main current path, the control electrodes of the first and the second MOS transistor (M1, M2) being coupled to a first reference terminal (R10) for receiving a first reference voltage (Rv10) to realize a conductive state of the first and the second MOS transistor (M1, M2) during a first active state of the current divider, the main current path of the first MOS transistor (M1) being coupled between the first terminal (I10) and the second terminal (O11), and the main current path of the second MOS transistor (M2) being coupled between the first terminal (I10) and the third terminal (O12). The current divider effect a current division such that the dimensions of the MOS transistors used dictate the proportion of the respective signals currents realized by the current divider.

20 Claims, 8 Drawing Sheets

CURRENT DIVIDER AND INTEGRATED CIRCUIT HAVING A PLURALITY OF CURRENT DIVIDERS

BACKGROUND OF THE INVENTION

The invention relates to a current divider for dividing a first signal current into a second and a third signal current, which current divider comprises a first terminal for the passage of the first signal current, a second terminal for the passage of the second signal current and for receiving a first potential, a third terminal for the passage of the third signal current and for receiving a second potential, at least a first element coupled between the first terminal and the second terminal, and at least a second element coupled between the first terminal and the third terminal.

The invention also relates to an integrated circuit comprising a plurality of current dividers.

In the present document a signal current is to be understood to mean a current resulting from an input current applied to a current divider, the first and the second element carrying, besides the respective signal currents, a bias current determined by the first and the second potential.

Such a current divider is suitable for general use in integrated circuits, which integrated circuits can be constructed, for example, as a volume control or as a digital-to-analog converter.

Such a current divider in which the first and the second element are realised by means of a first and a second resistor respectively is generally known. In the current divider implemented by means of the first and the second resistor an input current applied to the first terminal and corresponding to the first signal current is divided in accordance with a ratio dictated by a resistance value represented by the first and the second resistor.

A disadvantage of the current divider realised by means of the first and the second resistor is that the resistors occupy a comparatively large semiconductor area in an integrated circuit and the resistance values, which are influenced by parasitic effects, give rise to a usually non-linear and comparatively inaccurate current division. The relevant parasitic effects occur particularly when a transistor switch for switching the respective signal currents is coupled in series with both the first and the second resistor, which switch exhibits a conductance which varies depending upon the respective signal current.

SUMMARY OF INVENTION

It is an object of the invention to provide a current divider which realises a substantially linear and comparatively accurate current division by means of a compact circuit, enabling the respective signal currents to be switched without being affected by an influence occurring during current division.

A current divider in accordance with the invention is characterised in that the first element is implemented by means of a first MOS transistor having a control electrode and a main current path, and the second element is implemented by means of a second MOS transistor having a control electrode and a main current path, the control electrodes of the first and the second MOS transistor being coupled to a first reference terminal for receiving a first reference voltage to realise a conductive state of the first and the second MOS transistor during a first active state of the current divider, the main current path of the first MOS transistor being coupled between the first terminal and the second terminal and the main current path of the second MOS transistor being coupled between the first terminal and the third terminal. In the present document an active state of a current divider is to be understood to mean a state in which the current divider is capable of realising a current division of an input current. For the current divider characterised above this means that the first active state corresponds to the conductive state of the first and the second MOS transistor because a current division is impossible in a cut-off state of the first or the second MOS transistor. However, the invention is based on the recognition of the fact that the main current path of a MOS transistor inherently exhibits a symmetry, on the basis of which symmetry the current divider characterised above realises a current division, which current division is independent of an input current applied to the first terminal and independent of the potentials on the respective terminals. The current division realised by the current divider characterised above is particularly surprising because a MOS transistor exhibits a non-linear relationship between a voltage across its main current path and a current through its main current path, whilst the current division realised by the current divider characterised above is substantially linear. The said properties of the current divider in accordance with the invention will be corroborated by the theory derived on some of the following pages with reference to a drawing. Nevertheless, a requirement to obtain the relevant properties is that the first and the second MOS transistor have the same control-electrode potential and are in a conductive state, the current divider in accordance with the invention complying with this requirement by means of the first reference voltage, enabling the respective signal currents to be switched by means of the first reference voltage without being affected by an influence occurring during current division. Apart from the said properties the derived theory also corroborates that the current division realised by the current divider in accordance with the invention depends only on the ratios of the dimensions of the MOS transistors comprised by the current divider, allowing the dimensions to be chosen freely. As the current division depends only on the ratios of the dimensions of the MOS transistors comprised by the current divider, which ratios can be obtained with a high accuracy by means of present-day scaling techniques, the current divider in accordance with the invention provides a comparatively accurate current division and can be implemented by a compact circuit owing to the free choice of the dimensions. When the dimensions of the MOS transistors of the current divider are the same, an input current corresponding to the first signal current is divided into the second and the third signal current in a substantially linear fashion, as a result of which the current divider in accordance with the invention forms a particularly advantageous component for integrated circuits.

A first embodiment of a current divider in accordance with the invention may be characterised in that the current divider further comprises one or more further MOS transistors each having a control electrode and a main current path, the control electrodes being coupled to the first reference terminal for receiving the first reference voltage to realise a conductive state of the one or more further MOS transistors during the first active state of the current divider, and the main current paths being coupled in series between the main current path of the first MOS transistor and the second terminal. As the control electrodes of the one or more further MOS transistors are coupled to the first reference terminal for receiving the first reference voltage the MOS transistors of the present current divider are conductive in the first active state. As a result of the conductive state an input current applied to the first terminal and corresponding to the first signal current will be divided in dependence upon the ratios of the dimensions of the MOS transistors coupled between the first and the second terminal and the MOS transistor coupled between the first and the third terminal. When the dimensions of the MOS transistors in the present current divider are equal the one or more further MOS transistors merely provide an extension of the main current path of the first MOS transistor, as a result of which extension the ratio between the second and the third signal current is inversely proportional to the ratio between the number of MOS transistors between the first and the second terminal and the number of MOS transistors between the first and the third terminal. Thus, the current division realised by the present current divider can be adjusted to a desired value in a comparatively simple and accurate manner by means of a unity MOS transistor.

A second embodiment of a current divider in accordance with the invention may be characterised in that the current divider further comprises one or more further MOS transistors each having a control electrode and a main current path, the control electrodes being coupled to the first reference terminal for receiving the first reference voltage to realise a conductive state of the one or more further MOS transistors during the first active state of the current divider, and the main current paths being coupled in parallel to at least the main current path of the first MOS transistor. As the control electrodes of the one or more further MOS transistors are coupled to the first reference terminal for receiving the first reference voltage the MOS transistors comprised by the current divider are conductive in the first active state. As a result of the conductive state an input current applied to the first terminal and corresponding to the first signal current will be divided in dependence upon the ratios of the dimensions of the MOS transistors coupled between the first and the second terminal and the MOS transistor coupled between the first and the third terminal. When the dimensions of the MOS transistors in the present current divider are equal the one or more further MOS transistors merely provide a widening of the main current path of the second MOS transistor, as a result of which widening the ratio between the second and the third signal current is proportional to the ratio between the number of MOS transistors between the first and the second terminal and the number of MOS transistors between the first and the third terminal. Thus, the current division realised by the present current divider can be adjusted to a desired value in a comparatively simple and accurate manner by means of a unity MOS transistor.

A third embodiment of a current divider in accordance with the invention may be characterised in that the current divider further comprises one or more further MOS transistors each having a control electrode and a main current path, the control electrodes being coupled to the first reference terminal for receiving the first reference voltage to realise a conductive state of the one or more further MOS transistors during the first active state of the current divider, and the main current paths being coupled in series between the main current path of the second MOS transistor and the third terminal. As the control electrodes of the one or more further MOS transistors are coupled to the first reference terminal for receiving the first reference voltage the MOS transistors comprised by the current divider are conductive in the first active state. As a result of the conductive state an input current applied to the first terminal and corresponding to the first signal current will be divided in dependence upon the ratios of the dimensions of the MOS transistors coupled between the first and the second terminal and the MOS transistor coupled between the first and the third terminal. When the dimensions of the MOS transistors in the present current divider are equal the one or more further MOS transistors merely provide an extension of the main current path of the second MOS transistor, as a result of which extension the ratio between the second and the third signal current is inversely proportional to the ratio between the number of MOS transistors between the first and the second terminal and the number of MOS transistors between the first and the third terminal. Thus, the current division realised by the present current divider can be adjusted to a desired value in a comparatively simple and accurate manner by means of a unity MOS transistor.

A fourth embodiment of a current divider in accordance with the invention may be characterised in that the current divider further comprises one or more further MOS transistors each having a control electrode and a main current path, the control electrodes being coupled to the first reference terminal for receiving the first reference voltage to realise a conductive state of the one or more further MOS transistors during the first active state of the current divider, and the main current paths being coupled in parallel to at least the main current path of the second MOS transistor. As the control electrodes of the one or more further MOS transistors are coupled to the first reference terminal for receiving the first reference voltage the MOS transistors comprised by the current divider are conductive in the first active state. As a result of the conductive state an input current applied to the first terminal and corresponding to the first signal current will be divided in dependence upon the ratios of the dimensions of the MOS transistors coupled between the first and the second terminal and the MOS transistor coupled between the first and the third terminal. When the dimensions of the MOS transistors in the present current divider are equal the one or more further MOS transistors merely provide a widening of the main current path of the second MOS transistor, as a result of which widening the ratio between the second and the third signal current is proportional to the ratio between the number of MOS transistors between the first and the second terminal and the number of MOS transistors between the first and the third terminal. Thus, the current division realised by the present current divider can be adjusted to a desired value in a comparatively simple and accurate manner by means of a unity MOS transistor.

A fifth embodiment of a current divider in accordance with the invention may be characterised in that the current divider further comprises a fourth terminal for the passage of a fourth signal current, an inverter circuit, at least one further MOS transistor having a control electrode and a main current path, the control electrode being coupled to the first reference terminal by means of the inverter circuit for receiving the first reference voltage to realise a cut-off state of the at least one further MOS transistor during the first active state of the current divider, and to realise a conductive state of the at least one further MOS transistor during a passive state of the current divider, the main current path being coupled between the main current path of the first MOS transistor and the second terminal, and the fourth terminal being coupled to a point between the main current path of the first MOS transistor and the main current path of the at least one further MOS transistor. In the present document a passive state of a current divider is to be understood to mean a state in which the current divider is not capable of realising a current division of an input current. Since the present current divider can exhibit the first active state and the passive state a current division can be realized in dependence upon the first reference voltage. When the present current divider is in the first active state, in which an input current corresponding to the fourth signal current is applied to the fourth terminal, the first MOS transistor and the second MOS transistor allow the passage of the second signal current and the third signal current respectively. As the further MOS transistor is cut off during the first active state the second signal current will be equal to the input current applied to the fourth terminal, the first and the third signal current being determined by the input current (the second signal current) depending upon a circuit coupled to the first terminal. In the passive state a signal current flows through the further MOS transistor, which signal current is equal to the input current owing to the cut-off state of the first (and the second) MOS transistor. Consequently, the present current divider has the advantage that the input current is divided or not divided in dependence upon the state of the current divider, which state is dictated by the first reference voltage.

A sixth embodiment of a current divider in accordance with the invention may be characterised in that the current divider further comprises a fourth terminal for the passage of a fourth signal current, an inverter circuit, at least one further MOS transistor having a control electrode and a main current path, the control electrode being coupled to the first reference terminal by means of the inverter circuit for receiving the first reference voltage to realise a cut-off state of the at least one further MOS transistor during the first active state of the current divider, and to realise a conductive state of the at least one further MOS transistor during a passive state of the current divider, the main current path being coupled between the main current path of the second MOS transistor and the third terminal, and the fourth terminal being coupled to a point between the main current path of the second MOS transistor and the main current path of the at least one further MOS transistor. Since the present current divider can exhibit the first active state and the passive state a current division can be realized in dependence upon the first reference voltage. When the present current divider is in the first active state, in which an input current corresponding to the fourth signal current is applied to the fourth terminal, the first MOS transistor and the second MOS transistor allow the passage of the second signal current and the third signal current respectively. As the further MOS transistor is cut off during the first active state the third signal current will be equal to the input current applied to the fourth terminal, the first and the second signal current being determined by the input current (the third signal current) depending upon a circuit coupled to the first terminal. In the passive state a signal current flows through the further MOS transistor, which signal current is equal to the input current owing to the cut-off state of the second (and the first) MOS transistor. Consequently, the present current divider has the advantage that the input current is divided or not divided in dependence upon the state of the current divider, which state is dictated by the first reference voltage.

A seventh embodiment of a current divider in accordance with the invention may be characterised in that the current divider further comprises a fourth terminal for the passage of a fourth signal current, an inverter circuit, and at least one further MOS transistor having a control electrode and a main current path, the control electrode being coupled to the control electrode of the first MOS transistor by means of the inverter circuit, the control electrode of the first MOS transistor being coupled to a second reference terminal, coupled to the first reference terminal, for receiving a second reference voltage, derived from the first reference voltage, to realise a cut-off state of the at least one further MOS transistor during the first active state of the current divider, and to realise a conductive state of the at least one further MOS transistor during a second active state of the current divider, the main current path being coupled between the first terminal and the fourth terminal. The present embodiment differs considerably from the preceding embodiment because the current divider has a second active state. Whereas in the first active state the present current divider is capable of realising a current division by means of the first and the second MOS transistor, the current divider in the second active state is capable of realising a current division by means of the second and the at least one further MOS transistor. Consequently, an input current applied to the first terminal and corresponding to the first signal current can be divided in a first manner or in a second manner depending on the first reference voltage.

An eighth embodiment of a current divider in accordance with the invention may be characterised in that the current divider further comprises a fourth terminal for the passage of a fourth signal current, an inverter circuit, and at least one further MOS transistor having a control electrode and a main current path, the control electrode being coupled to the control electrode of the second MOS transistor by means of the inverter circuit, the control electrode of the second MOS transistor being coupled to a second reference terminal, coupled to the first reference terminal, for receiving a second reference voltage, derived from the first reference voltage, to realise a cut-off state of the at least one further MOS transistor during the first active state of the current divider, and to realise a conductive state of the at least one further MOS transistor during a second active state of the current divider, the main current path being coupled between the first terminal and the fourth terminal. The present embodiment, similarly to the seventh embodiment, differs considerably from the preceding embodiment because the current divider has a second active state. Whereas in the first active state the present current divider is capable of realising a current division by means of the first and the second MOS transistor, the current divider in the second active state is capable of realising a current division by means of the first and the at least one further MOS transistor. Consequently, an input current applied to the first terminal and corresponding to the first signal current can be divided in a first manner or in a second manner depending on the first reference voltage.

Although the embodiments described above have been presented separately they may be combined advantageously, for example, in an integrated circuit.

A first embodiment of an integrated circuit comprising a plurality of current dividers in accordance with the invention may be characterised in that the integrated circuit further comprises an input terminal for receiving an input current, and a first output terminal for supplying a first output current, the input terminal of the integrated circuit being coupled to a first terminal of a first current divider, a third terminal of the first current divider being coupled to a first terminal of a last current divider, and a third terminal of the last current divider being coupled to the first output terminal of the integrated circuit. The present integrated circuit is a simple series arrangement of a plurality of current dividers, employing for example current dividers in accordance with the first, the second, the third or the fourth embodiment. The integrated circuit is inter alia capable of dividing the input current into various further currents, including the output current and allows the ratio between the various further currents to be defined comparatively accurately.

A second embodiment of an integrated circuit comprising a plurality of current dividers in accordance with the invention may be characterised in that the integrated circuit further comprises an input terminal for receiving an input current, and a first output terminal for supplying a first output current, the input terminal of the integrated circuit being coupled to a fourth terminal of a first current divider, a first terminal of the first current divider being coupled to a fourth terminal of a last current divider, and a first terminal of the last current divider being coupled to the first output terminal of the integrated circuit. The present embodiment of an integrated circuit may employ, for example, the current dividers in accordance with the fifth and the sixth embodiment, by means of which current dividers it is possible to divide or not to divide a current. Owing to the use of the relevant current dividers the present integrated circuit has the advantage that the proportion in which the input current is divided can be controlled by means of the first reference voltage, the output current being obtained in the case of an active state of the current dividers comprised by the integrated circuit. Thus, the present integrated circuit enables, for example, a volume control to be realised.

A third embodiment of an integrated circuit comprising a plurality of current dividers in accordance with the invention may be characterised in that the integrated circuit further comprises an input terminal for receiving an input current, and a first output terminal for supplying a first output current, the input terminal of the integrated circuit being coupled to a fourth terminal of a first current divider of a first series arrangement of current dividers having a first current dividing factor, a first terminal of the first current divider of the first series arrangement of current dividers being coupled to a fourth terminal of a last current divider of the first series arrangement of current dividers, respective second terminals of the respective current dividers of the first series arrangement being coupled to a fourth terminal of a first current divider of a second series arrangement of current dividers having a second current dividing factor, a first terminal of the second series arrangement of current dividers being coupled to a fourth terminal of a last current divider of the second series arrangement of current dividers, and respective second terminals of the respective current dividers of the second series arrangement being coupled to the first output terminal of the integrated circuit. The present embodiment is capable of dividing the input current in both series arrangements in a manner corresponding to that in the second embodiment, the first series arrangement for example effecting a coarse division and the second series arrangement for example effecting a fine division. Thus, the present embodiment enables a compact and accurate signal attenuator to be realised, which signal attenuator is particularly suitable for realising a volume control.

A fourth embodiment of an integrated circuit comprising a plurality of current dividers in accordance with the invention may be characterised in that the integrated circuit further comprises an input terminal for receiving an input current, and a first output terminal for supplying a first output current, the input terminal of the integrated circuit being coupled to a first terminal of the first current divider, a third terminal of the first current divider being coupled to a first terminal of the last current divider, and a second terminal of the last current divider being coupled to the first output terminal of the integrated circuit. By means of the control circuit, which can be constructed in a manner known per se, the individual current dividers can be set to the first or the second active state or to the passive state, the required voltages being derived from the first reference voltage, for example by means of some MOS transistors operated as switches.

A seventh embodiment of an integrated circuit comprising a plurality of current dividers in accordance with the invention may be characterised in that the integrated circuit further comprises a further input terminal for receiving an input voltage, a further output terminal for supplying an output voltage, a voltage-to-current converter, and a current-to-voltage converter, the voltage-to-current converter being coupled between the further input terminal of the integrated circuit and the input terminal of the integrated circuit, and the current-to-voltage converter being coupled between the first output terminal of the integrated circuit and the further output terminal of the integrated circuit. Since the described current dividers operate in the current domain the seventh embodiment has the advantage that the integrated circuit can handle a voltage, which is generally the case in a volume control.

An eighth embodiment of an integrated circuit comprising a plurality of current dividers in accordance with the invention may be characterised in that the integrated circuit further comprises a reference terminal for receiving a reference voltage and a further reference terminal for receiving a further reference voltage, and the voltage-to-current converter comprises a resistive element, at least one MOS transistor having a control electrode and a main current path, and an operational amplifier having an inverting input, having a non-inverting input, and having an output, the inverting input being coupled to the further input terminal of the integrated circuit by means of the resistive element, the non-inverting input being coupled to the first reference terminal, the output being coupled to the inverting input by means of the main current path of the at least one MOS transistor and to a terminal of the first current divider, and the control electrode of the at least one MOS transistor being coupled to the second reference terminal of the integrated circuit. The present embodiment comprises a special version of the voltage-to-current converter, which special version is not subject to non-linear effects as a result of a parasitic capacitance appearing at the output of the first operational amplifier. The relevant non-linear effects are avoided in that the operational amplifier is included in a feedback loop, which feedback loop further comprises the at least one MOS transistor, a further current divider being realised by the relevant MOS transistor and a MOS transistor coupled to the input terminal and forming part of the first current divider. Whereas the further current divider linearly divides a current applied to the further current divider by the operational amplifier into an input current through the input terminal and a current through the at least one MOS transistor, the last-mentioned current is also determined by a voltage drop produced across the resistive element by the input voltage. Consequently, the operational amplifier supplies a current to the further current divider, which current is not determined by a current supplied to the parasitic capacitance by the operational amplifier.

BRIEF DESCRIPTION OF THE DRAWINGS

The above and other (more elaborate) features of the invention will now be described in more detail with reference to the accompanying drawings, in which.

DESCRIPTION OF THE PREFERRED EMBODIMENTS

Figure 1:
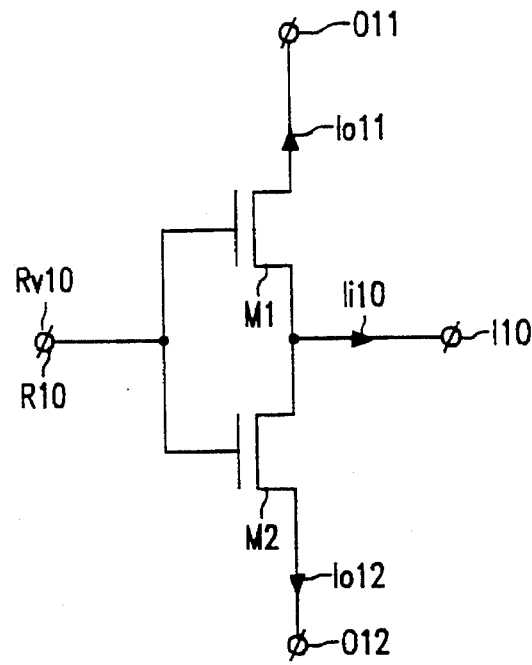
FIG. 1 shows a first embodiment of a current divider in accordance with the invention.

FIG. 1 shows a first embodiment of a current divider in accordance with the invention. The present embodiment comprises a first terminal I10 for the passage of a first signal current Ii10, a second terminal O11 for the passage of a second signal current Io11 and for receiving a first potential, a third terminal O12 for the passage of a third signal current Io12 and for receiving a second potential, a first MOS transistor M1 having a control electrode and a main current path, and a second MOS transistor M2 having a control electrode and a main current path. The control electrodes of the MOS transistors M1 and M2 are coupled to a reference terminal R10 for receiving a first reference voltage Rv10 to realise a conductive state of the MOS transistors M1 and M2 during a first active state of the current divider, the main current path of the MOS transistor M1 being coupled between the terminal I10 and the terminal O11 and the main current path of the MOS transistor M2 being coupled between the terminal I10 and the terminal O12. Since the respective main current paths exhibit a symmetry which is inherent in a MOS transistor a current divider in accordance with the invention comprising two or more MOS transistors performs a linear current division independently of the signal current Ii10 in the current divider and independently of the potentials on said terminals O11 and O12, which linear current division is corroborated by means of the theory derived hereinafter. The relevant theory is based on an equation (1) given below, which equation is a general equation for a current flowing through the main current path of a MOS transistor (R. S. Muller and T. I. Kamins, "Device Electronics for Integrated Circuits", Wiley, N.Y., 1977).

$$I_d = -\frac{W}{L} \int_{V_s}^{V_d} \mu(V_g, V_c) Q(V_g, V_c) dV_c \qquad (1)$$

In the general equation (1) $I_d$ represents the current flowing through the main current path, $V_g$ is a potential on the control electrode (gate), $V_d$ is a potential of a first side (drain) of the main current path, $V_s$ is a potential of a second side (source) of the main current path, $V_c$ is a potential on a point of the main current path, W is the width of the main current path, L is the length of the main current path, $\mu$ is the mobility of the charge carders, and Q is the channel charge per unit area, the carrier mobility $\mu$ and the channel charge per unit area Q being a function of the control-electrode potential $V_g$ and of the potential of the point of the main current path $V_c$. Both the carder mobility $\mu(V_g, V_c)$ and the channel charge per unit area $Q(V_g, v_c)$ can be a complicated function, particularly when both first-order and second-order effects, such as mobility reduction and body effect, are considered. Yet, on the basis of the following equation (2)

$$F(V_g, V_x) = \int_{-\infty}^{V_x} \mu(V_g, V_c) Q(V_g, V_c) dV_c \qquad (2)$$

the current $I_d$ through the main current path (equation (1)) can be expressed in simplified form by the following equation (3)

$$I_d = W/L\{F(V_g, V_s) - F(V_g, V_d)\} \qquad (3)$$

which equation clearly expresses the symmetry inherent in a MOS transistor. When the above equation (3) is drawn up for the MOS transistors M1 and M2 shown in FIG. 1 the currents in the respective main current paths comply with $$I_{dM1} = \frac{W_{M1}}{L_{M1}} \{F(V_{R10}, V_{O11}) - F(V_{R10}, V_{I10})\} \qquad (4)$$

and $$I_{dM2} = \frac{W_{M2}}{L_{M2}} \{F(V_{R10}, V_{O12}) - F(V_{R10}, V_{I10})\} \qquad (5)$$

where the potential $V_{I10}$ in equations (4) and (5) is a non-linear function of the signal current Ii10 and where the potentials $V_{O11}$ and $V_{O12}$ are constant and independent of Ii10. If the potential $V_{I10}$ for a given signal current Ii10 is represented as a potential $V_{I10}(0)$, a change of the relevant signal current Ii10 results in a change of the currents $I_{dM1}$ and $I_{dM2}$ through the main current paths, the respective changes being given by $$\Delta I_{dM1} = Io11 = \frac{W_{M1}}{L_{M1}} \{F(V_{R10}, V_{I10}(Ii10)) - F(V_{R10}, V_{I10}(0))\} \qquad (6)$$

and $$\Delta I_{dM2} = Io12 = \frac{W_{M2}}{L_{M2}} \{F(V_{R10}, V_{I10}(Ii10)) - F(V_{R10}, V_{I10}(0))\} \qquad (7)$$

From the above equations (6) and (7) the next equation (8) for the current division of the signal current Ii10 can be derived $$\frac{I011}{I012} = \frac{W_{M1} L_{M2}}{W_{M2} L_{M1}} \quad (8)$$

which equation represents a current dividing factor dictated by the dimensions of the MOS transistors. Equation (8) corroborates the above statements that the current division, i.e. the current dividing factor, is independent of the signal current Ii10 and independent of the potentials $V_{O11}$ and $V_{O12}$. For a complete description of the current divider in accordance with the invention the following equation (9) is required in addition to equation (8)

$$\text{Ii10}=-\text{Io11}-\text{Io12} \quad (9)$$

which equation represents the change of the signal current Ii10 in relation to the respective signal currents Io11 and Io12. From equations (8) and (9) it follows that in the case of an input current corresponding to the signal current Ii10 this defines the other signal currents (Io11, Io12). In addition to the above considerations it is to be noted, on the basis of the above derivation, that the current division is substantially linear and that the current division applies both to the non-saturated and the saturated state conductive state of the individual MOS transistors, the dimensions of the MOS transistors required for current divider not being specified, which enables a compact current divider to be realised.

Figure 2:
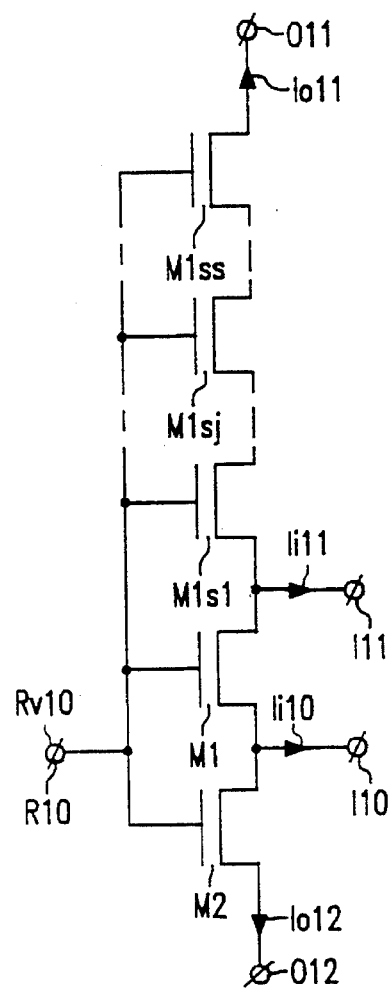
FIG. 2 shows a second embodiment of a current divider in accordance with the invention.

FIG. 2 shows a second embodiment of a current divider in accordance with the invention. The present embodiment differs from the current divider shown in FIG. 1 in that the present embodiment further comprises a fourth terminal I11 for a fourth signal current Ii11 and three further MOS transistors M1s1, M1sj and M1ss each having a control electrode and a main current path. The terminal I11 is coupled to a point between the main current paths of the MOS transistors M1 and M1s1, the control electrodes are coupled to the reference terminal R10, and the main current paths are serially coupled between the main current path of the MOS transistor M1 and the terminal O11. Although FIG. 2 shows only four terminals I10, I11, O11 and O12 a further terminal for a further signal current may be coupled between the main current paths of each of the MOS transistors M1s1, M1sj and M1ss. The present current divider effects a current division which depends on the use of the respective terminals and on both the dimensions and the number of the respective MOS transistors. For example, when the terminal I10 is used as an input terminal, the terminal I11 is not used, and the terminals O11 and O12 are used as output terminals, the present current divider effects a current division defined by the dimensions of the MOS transistor M2 relative to the dimensions of the serially coupled MOS transistors M1, M1s1, M1sj and M1ss. If the relevant MOS transistors have equal dimensions, which equal dimensions can be realised simply by means of present-day scaling techniques, it can be demonstrated by means of equation (8) that the present current divider effects a current division which is inversely proportional to the ratio between the number of MOS transistors between the terminal I10 and the terminal O11 and the number of MOS transistors between the terminal I10 and the terminal O12. As a result of this, the signal current Io11 is four times as small as the signal current Io12. In the case of unequal dimensions of the relevant MOS transistors or in the case of another use of the terminals the current division can be defined in a manner similar to that set forth above.

Figure 3:
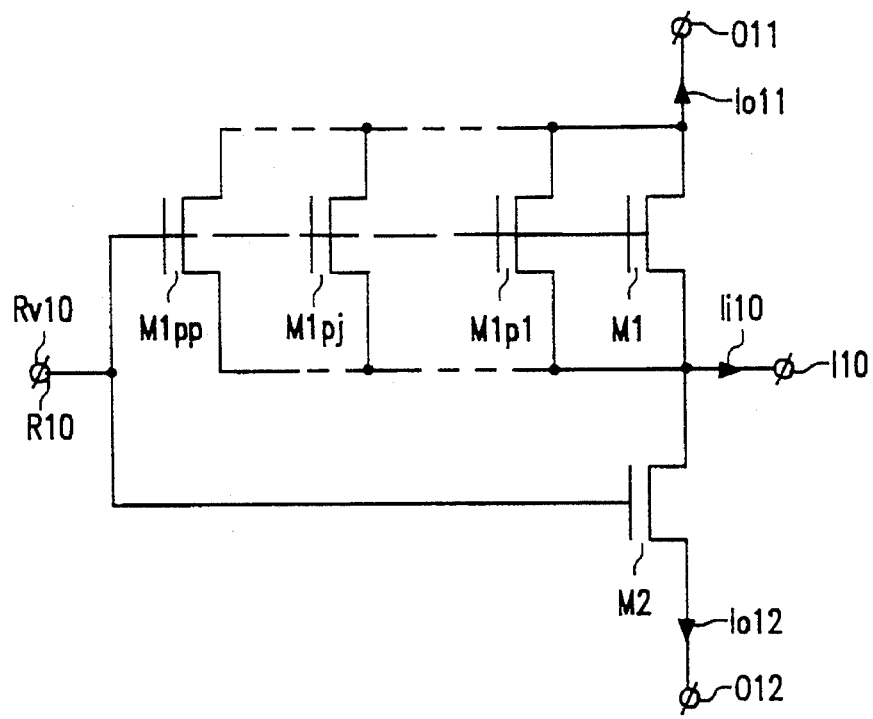
FIG. 3 shows a third embodiment of a current divider in accordance with the invention.

FIG. 3 shows a third embodiment of a current divider in accordance with the invention. The present embodiment differs from the current divider shown in FIG. 1 in that the present embodiment further comprises three further MOS transistors M1p1, M1pj and M1pp each having a control electrode and a main current path, the control electrodes being coupled to the reference terminal R10, and the main current paths being coupled in parallel with the main current path of the MOS transistor M1. The present current divider effects a current division which depends on the use of the respective terminals and on both the dimensions and the number of the respective MOS transistors. For example, when the terminal I10 is used as an input terminal, and the terminals O11 and O12 are used as output terminals, the present current divider effects a current division defined by the dimensions of the MOS transistor M2 relative to the dimensions of the parallel coupled MOS transistors M1, M1p1, M1pj and M1pp. If the relevant MOS transistors have equal dimensions, it can be demonstrated by means of equation (8) that the present current divider effects a current division which is proportional to the ratio between the number of MOS transistors between the terminal I10 and the terminal O11 and the number of MOS transistors between the terminal I10 and the terminal O12. As a result of this, the signal current Io11 is four times as large as the signal current Io12. In the case of unequal dimensions of the relevant MOS transistors or in the case of another use of the terminals the current division can be defined in a manner similar to that set forth above.

Figure 4:
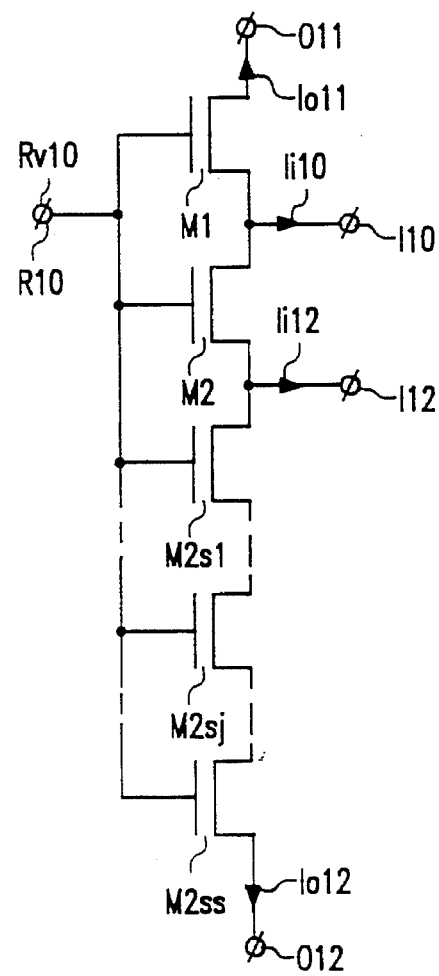
FIG. 4 shows a fourth embodiment of a current divider in accordance with the invention.

FIG. 4 shows a fourth embodiment of a current divider in accordance with the invention. The present embodiment differs from the current divider shown in FIG. 1 in that the present embodiment further comprises a fourth terminal I12 for a fourth signal current Ii12 and three further MOS transistors M2s1, M2sj and M2ss each having a control electrode and a main current path. The terminal I12 is coupled to a point between the main current paths of the MOS transistors M2 and M2s1, the control electrodes are coupled to the reference terminal R10, and the main current paths are serially coupled between the main current path of the MOS transistor M2 and the terminal O12. Although FIG. 4 shows only four terminals I10, I12, O11 and O12 a further terminal for a further signal current may be coupled between the main current paths of each of the MOS transistors M2s1, M2sj and M2ss. The present current divider effects a current division which depends on the use of the respective terminals and on both the dimensions and the number of the respective MOS transistors. For example, when the terminal I10 is used as an input terminal, the terminal I11 is not used, and the terminals O11 and O12 are used as output terminals, the present current divider effects a current division defined by the dimensions of the MOS transistor M1 relative to the dimensions of the serially coupled MOS transistors M2, M2s1, M2sj and M2ss. If the relevant MOS transistors have equal dimensions, it can be demonstrated by means of equation (8) that the present current divider effects a current division which is inversely proportional to the ratio between the number of MOS transistors between the terminal I10 and the terminal O11 and the number of MOS transistors between the terminal I10 and the terminal O12. As a result of this, the signal current Io11 is four times as large as the signal current Io12. In the case of unequal dimensions of the relevant MOS transistors or in the case of another use of the terminals the current division can be defined in a manner similar to that set forth above.

Figure 5:
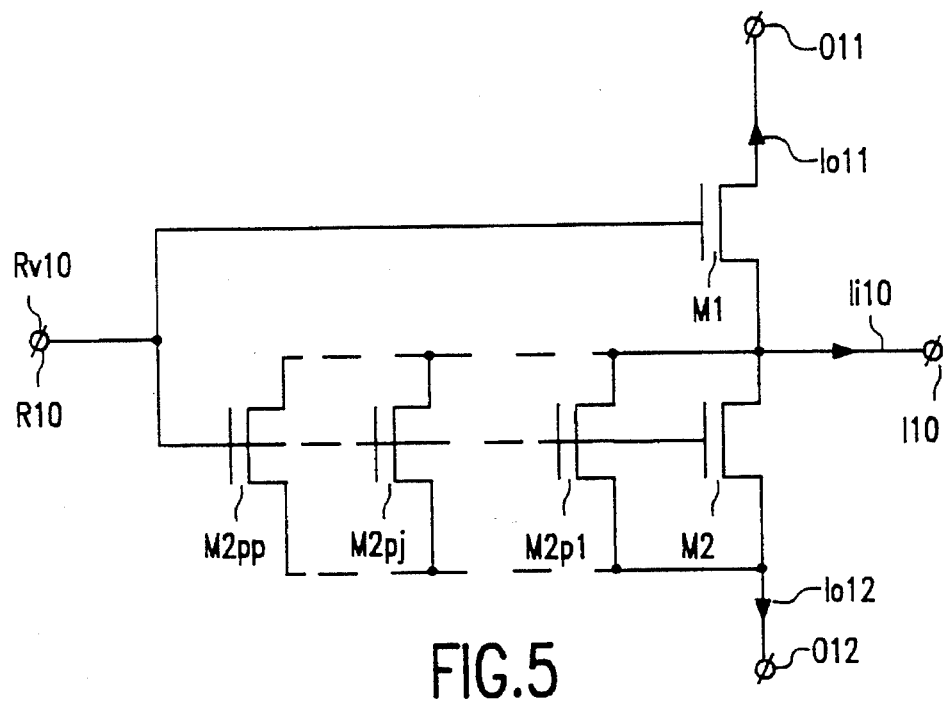
FIG. 5 shows a fifth embodiment of a current divider in accordance with the invention.

FIG. 5 shows a fifth embodiment of a current divider in accordance with the invention. The present embodiment differs from the current divider shown in FIG. 1 in that the present embodiment further comprises three further MOS transistors M2p1, M2pj and M2pp each having a control electrode and a main current path, the control electrodes being coupled to the reference terminal R10, and the main current paths being coupled in parallel with the main current path of the MOS transistor M2. The present current divider effects a current division which depends on the use of the respective terminals and on both the dimensions and the number of the respective MOS transistors. For example, when the terminal I10 is used as an input terminal, and the terminals O11 and O12 are used as output terminals, the present current divider effects a current division defined by the dimensions of the MOS transistor M1 relative to the dimensions of the parallel coupled MOS transistors M2, M2p1, M2pj and M2pp. If the relevant MOS transistors have equal dimensions, it can be demonstrated by means of equation (8) that the present current divider effects a current division which is proportional to the ratio between the number of MOS transistors between the terminal I10 and the terminal O11 and the number of MOS transistors between the terminal I10 and the terminal O12. As a result of this, the signal current Io11 is four times as small as the signal current Io12. In the case of unequal dimensions of the relevant MOS transistors or in the case of another use of the terminals the current division can be defined in a manner similar to that set forth above.

Figures 6A, 6B:
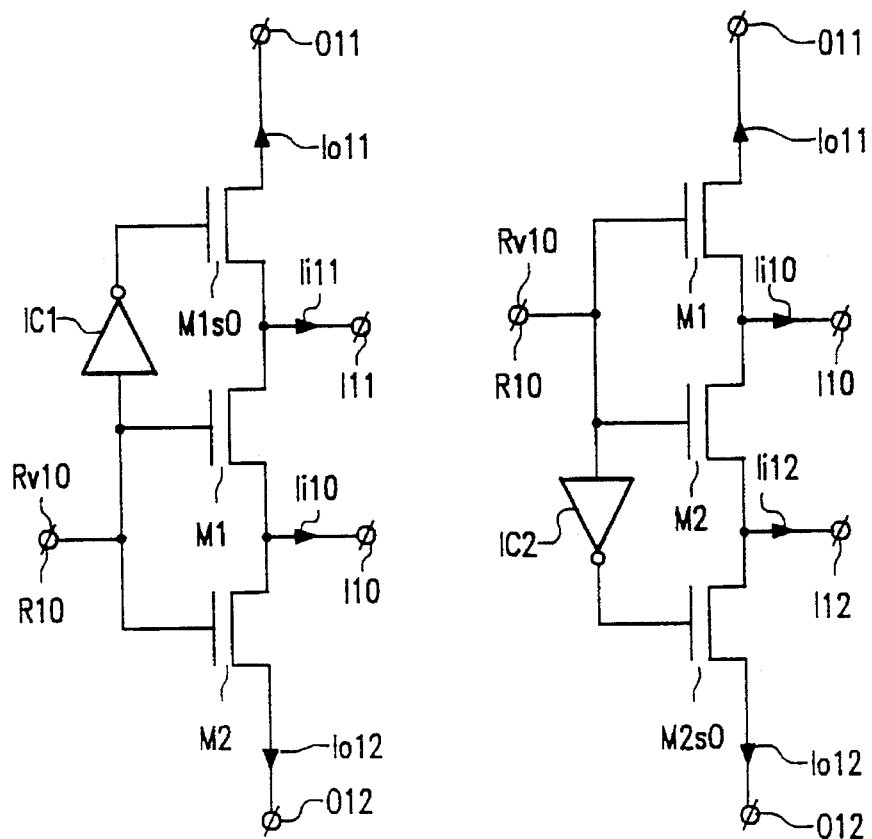
FIG. 6A shows a sixth embodiment of a current divider in accordance with the invention.
FIG. 6B shows a seventh embodiment of a current divider in accordance with the invention.

FIG. 6A shows a sixth embodiment of a current divider in accordance with the invention. The present embodiment, which comprises one further MOS transistor M1s0 having a control electrode and a main current path, differs from the current divider shown in FIG. 2 in that the present embodiment further comprises an inverter circuit IC1, the control electrode being coupled to the reference terminal R10 by means of the inverter circuit IC1, and the main current path, similarly to the MOS transistors M1s1, M1sj and M1ss shown in FIG. 2, being coupled between the main current path of the MOS transistor M1 and the terminal O11. Depending on the reference voltage Rv10 the present current divider assumes a first active or a passive state. In the first active state of the current divider the reference voltage Rv10 causes the MOS transistors M1 and M2 to be turned on and the MOS transistor M1s0 to be turned off by means of the inverter circuit IC1, whereas in the passive state of the current divider the reference voltage Rv10 causes the MOS transistors M1 and M2 to be turned off and the MOS transistor M1s0 to be turned on by means of the inverter circuit IC1. When the present current divider is in the first active state, in which an input current corresponding to the fourth signal current Ii11 is applied to the terminal I11, the MOS transistor M1 and the MOS transistor M2 allow the passage of the respective signal currents. As the MOS transistor M1s0 is cut off during the first active state the signal current through the MOS transistor M1 will be equal to the input current (Ii11) applied to the terminal I11, the signal currents being determined by the input current (Ii11) depending upon a circuit coupled to the terminal (I10). In the passive state the signal current Io11 flows through the MOS transistor M1s0, which signal current is equal to the input current (Ii11) owing to the cut-off state of the MOS transistor M1. Consequently, the present current divider has the advantage that the input current (Ii11) is divided or not divided in dependence upon the state of the current divider, which state is dictated by the first reference voltage Rv10.

FIG. 6B shows a seventh embodiment of a current divider in accordance with the invention. The present embodiment, which comprises one further MOS transistor M2s0 having a control electrode and a main current path, differs from the current divider shown in FIG. 4 in that the present embodiment further comprises an inverter circuit IC2, the control electrode being coupled to the reference terminal R10 by means of the inverter circuit IC2, and the main current path, similarly to the MOS transistors M2s1, M2sj and M2ss shown in FIG. 4, being coupled between the main current path of the MOS transistor M2 and the terminal O12. Depending on the reference voltage Rv10 the present current divider assumes a first active or a passive state. In the first active state of the current divider the reference voltage Rv10 causes the MOS transistors M1 and M2 to be turned on and the MOS transistor M2s0 to be turned off by means of the inverter circuit IC2, whereas in the passive state of the current divider the reference voltage Rv10 causes the MOS transistors M1 and M2 to be turned off and the MOS transistor M2s0 to be turned on by means of the inverter circuit IC2. When the present current divider is in the first active state, in which an input current corresponding to the fourth signal current Ii12 is applied to the terminal I11, the MOS transistor M2 and the MOS transistor M1 allow the passage of the respective signal currents. As the MOS transistor M2s0 is cut off during the first active state the signal current through the MOS transistor M2 will be equal to the input current (Ii12) applied to the terminal 112, the signal currents being determined by the input current (Ii12) depending upon a circuit coupled to the terminal I10. In the passive state the signal current Io12 flows through the MOS transistor M2s0, which signal current is equal to the input current (Ii12) owing to the cut-off state of the MOS transistor M2. Consequently, the present current divider has the advantage that the input current (Ii12) is divided or not divided in dependence upon the state of the current divider, which state is dictated by the first reference voltage Rv10.

Figure 7A:
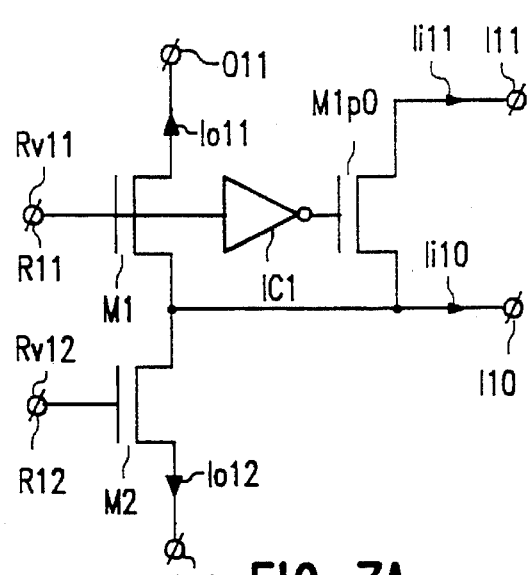
FIG. 7A shows an eighth embodiment of a current divider in accordance with the invention.

FIG. 7A shows an eighth embodiment of a current divider in accordance with the invention. The present embodiment, which comprises one further MOS transistor M1p0 having a control electrode and a main current path, differs from the current divider shown in FIG. 3 in that the present embodiment further comprises a fourth terminal I11 for a fourth signal current Ii11 and an inverter circuit IC1, the control electrode being coupled to the control electrode of the MOS transistor M1 by means of the inverter circuit IC1, and the main current path, in another way than in the circuit shown in FIG. 3, being coupled between the terminal I10 and the terminal I11. In addition, the present embodiment differs from the embodiments shown in the preceding Figures in that the control electrode of the MOS transistor M1 is coupled to a reference terminal R11 for receiving a reference voltage Rv11 and in that the control electrode of the MOS transistor M2 is coupled to a reference terminal R12 for receiving a reference voltage Rv12. Nevertheless, a coupling of the control electrodes of the MOS transistors M1 and M2 is provided by means of a control circuit CC, which control circuit is shown in some of the following Figures, the reference voltages Rv11 and Rv12 being derived from the reference voltage Rv10 mentioned in the description with reference to the preceding Figures. In comparison with the preceding embodiments the present embodiment has a second active state in addition to the first active state. In the first active state of the current divider the reference voltage Rv11 causes the MOS transistor M1 to be turned on and the MOS transistor M1p0 to be turned off by means of the inverter circuit IC1, and the reference voltage Rv12 causes the MOS transistor M2 to be turned on. Thus, the current divider subjects the signal current Ii10 to a current division as defined by the equations (8) and (9), which current division results in the signal currents Io11 and Io12. In the second active state of the current divider the reference voltage Rv11 causes the MOS transistor M1 to be turned on and the MOS transistor M1p0 to be turned on by means of the inverter circuit IC1, and the reference voltage Rv12 causes the MOS transistor M2 to be turned on. Consequently, the current divider subjects the signal current Ii10 to a current division as defined by the equations (8) and (9), which current division results in the signal currents Ii11 and Io12. Thus, the present current divider enables the signal current to be transferred to a further current divider, divided in a first way or divided in a second way depending on the reference voltage Rv11 derived from the reference voltage Rv10.

Figure 7B:
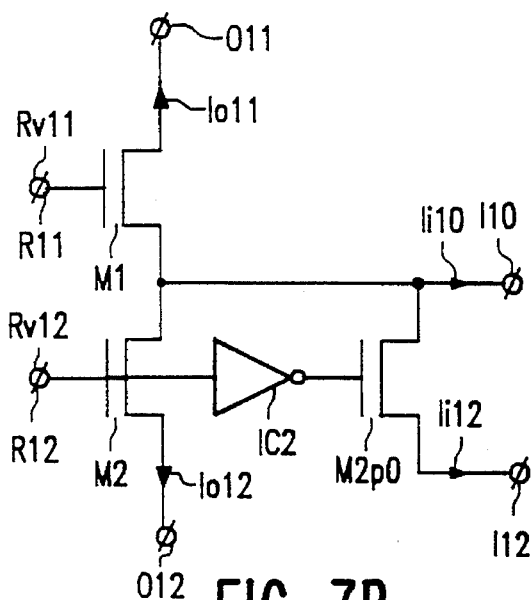
FIG. 7B shows a ninth embodiment of a current divider in accordance with the invention.

FIG. 7B shows a ninth embodiment of a current divider in accordance with the invention. The present embodiment, which comprises one further MOS transistor M2p0 having a control electrode and a main current path, differs from the current divider shown in FIG. 5 in that the present embodiment further comprises a fourth terminal I12 for a fourth signal current Ii12 and an inverter circuit IC2, the control electrode being coupled to the control electrode of the MOS transistor M2 by means of the inverter circuit IC2, and the main current path, in another way than in the circuit shown in FIG. 5, being coupled between the terminal I10 and the terminal I12. In addition, the present embodiment differs from the embodiments shown in the preceding Figures in that the control electrode of the MOS transistor M1 is coupled to a reference terminal R11 for receiving a reference voltage Rv11 and in that the control electrode of the MOS transistor M2 is coupled to a reference terminal R12 for receiving a reference voltage Rv12. Nevertheless, a coupling of the control electrodes of the MOS transistors M1 and M2 is provided by means of a control circuit CC, which control circuit is shown in some of the following Figures, the reference voltages Rv11 and Rv12 being derived from the reference voltage Rv10 mentioned in the description with reference to the preceding Figures. In the same way as the embodiment shown in FIG. 7A the present embodiment has a second active state in addition to the first active state. In the first active state of the current divider the reference voltage Rv11 causes the MOS transistor M1 to be turned on, and the reference voltage Rv12 causes the MOS transistor M2 to be turned on and the MOS transistor M2p0 to be turned off by means of the inverter circuit IC2. Thus, the current divider subjects the signal current Ii10 to a current division as defined by the equations (8) and (9), which current division results in the signal currents Io11 and Io12. In the second active state of the current divider the reference voltage Rv11 causes the MOS transistor M1 to be turned on, and the reference voltage Rv12 causes the MOS transistor M2 to be turned off and the MOS transistor M2p0 to be turned on by means of the inverter circuit IC2. Consequently, the current divider subjects the signal current Ii10 to a current division as defined by the equations (8) and (9), which current division yields the signal currents Ii11 and Io12. Thus, the present current divider enables the signal current to be transferred divided in a first way or divided in a second way depending on the reference voltage Rv12 derived from the reference voltage Rv10.

Figure 8:
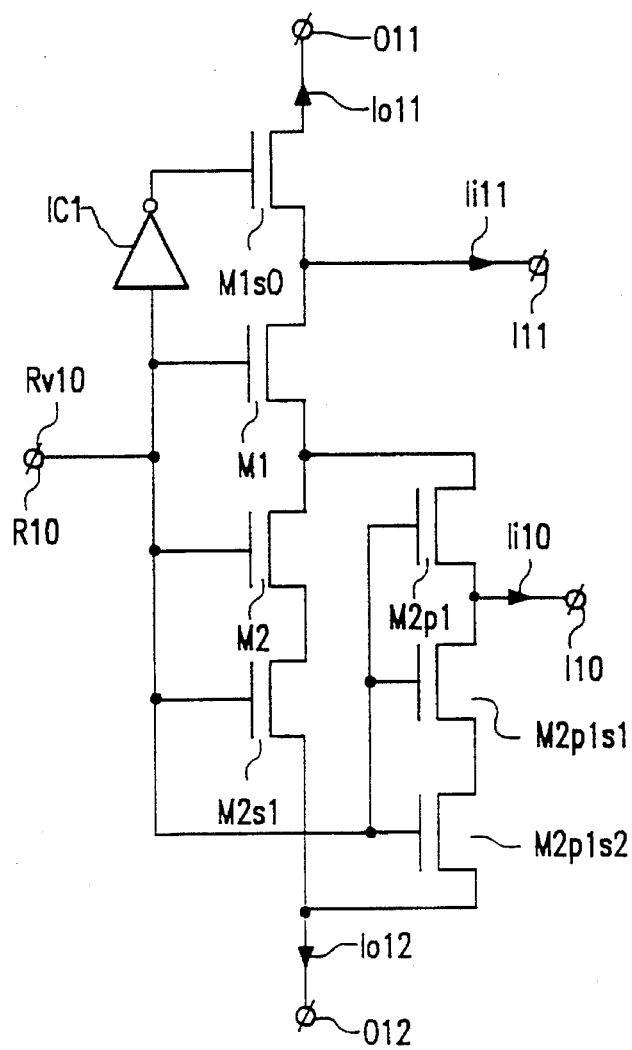
FIG. 8 shows a tenth embodiment of a current divider in accordance with the invention.

FIG. 8 shows a tenth embodiment of a current divider in accordance with the invention. The present embodiment is constructed in analogy to the current dividers shown in FIGS. 4, 5 and 6A. The present embodiment, which comprises only one further MOS transistor M2s1 coupled in series with the MOS transistor M2, differs from the current dividers shown in the preceding Figures in that the present embodiment further comprises three further MOS transistors M2p1, M2p1s1 and M2p1s2 which are coupled parallel to the MOS transistor M2 and which each comprise a control electrode and a main current path, the control electrodes of the MOS transistors M2p1, M2p1s1 and M2p1s2 similarly to the control electrode of the MOS transistor M2s1 being coupled to the reference terminal R10, the main current paths of the MOS transistors M2p1, M2p1s1 and M2p1s2 being coupled parallel to the main current paths of the MOS transistors M2 and M2s1, and the terminal I10 being coupled to a point situated between the main current paths of the MOS transistors M2p1 and M2p1s1. The present current divider is a first example of a combination of the current dividers shown in the preceding Figures, the signal current Ii11 being divided into the signals currents Ii10 and Ii12 in a first active state of the current divider, and the signal current being opposite and equal to the signal current Io11 in a passive state of the current divider. As the present current divider comprises two sections (M1, M2, M2s1 and M2p1, M2p1s1, M2p1s2 respectively) of a ladder network (a so-called R-2R network), it is easy to see that in the first active state of the current divider forming part of a ladder network the signal current Ii10 is attenuated by approximately twelve decibels relative to the signal current Ii11 (each section produces an attenuation of approximately six decibels as a result of the R-2R ratio), provided that the last current divider of the ladder network is terminated in a customary manner by means of two serially coupled MOS transistors.

Figure 9:
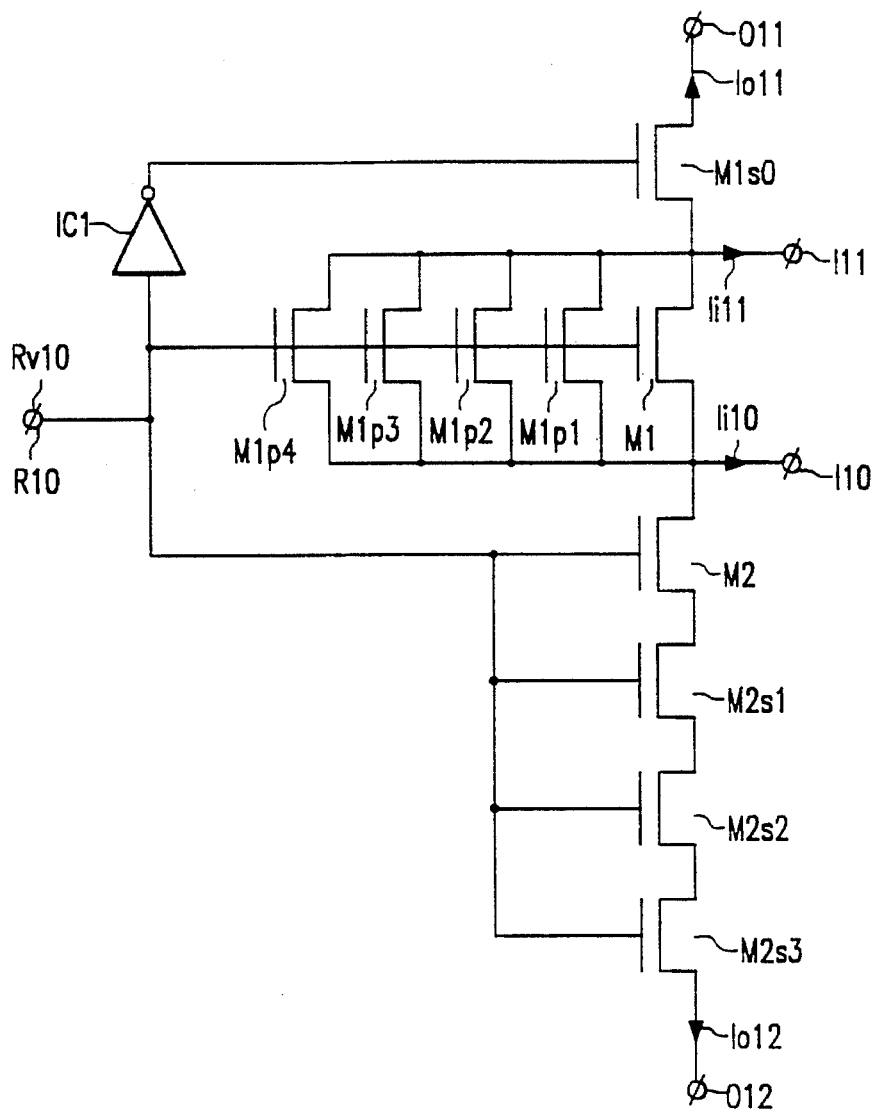
FIG. 9 shows an eleventh embodiment of a current divider in accordance with the invention.

FIG. 9 shows an eleventh embodiment of a current divider in accordance with the invention. The present embodiment is constructed in analogy to the current dividers shown in FIGS. 3, 4 and 6A. The present embodiment, differs from the current dividers shown in the preceding Figures in that the present embodiment further comprises four further MOS transistors M1p1, M1p2, M1p3 and M1p4 which are coupled parallel to the MOS transistor M1 and each comprise a control electrode and a main current path, and three MOS transistors M2s1, M2s2 and M2s3 coupled in series with the MOS transistor M2. The control electrodes of the MOS transistors M1p1, M1p2, M1p3, M1p4, M2s1, M2s2 and M2s3 are coupled to the reference terminal R10, the main current paths of the MOS transistors M1p1, M1p2, M1p3 and M1p4 being coupled parallel to the main current path of the MOS transistor M1, and the main current paths of the MOS transistors M2s1, M2s2 and M2s3 are coupled in series between the main current path of the MOS transistor M2 and the terminal O12. The present current divider is a second example of a combination of the current dividers shown in the preceding Figures, the signal current Ii11 being divided into the signals currents Ii10 and Io12 in a first active state of the current divider in a manner similar to that shown in FIG. 6A, and the signal current Ii11 being equal to the signal current in the MOS transistor M1s0 in a passive state of the current divider. The present current divider, which forms part of an integrated circuit, produces an attenuation of approximately two decibels relative to the signal current Ii11, provided that the last current divider of the ladder network is terminated in a customary manner by means of two serially coupled MOS transistors.

Figure 10:
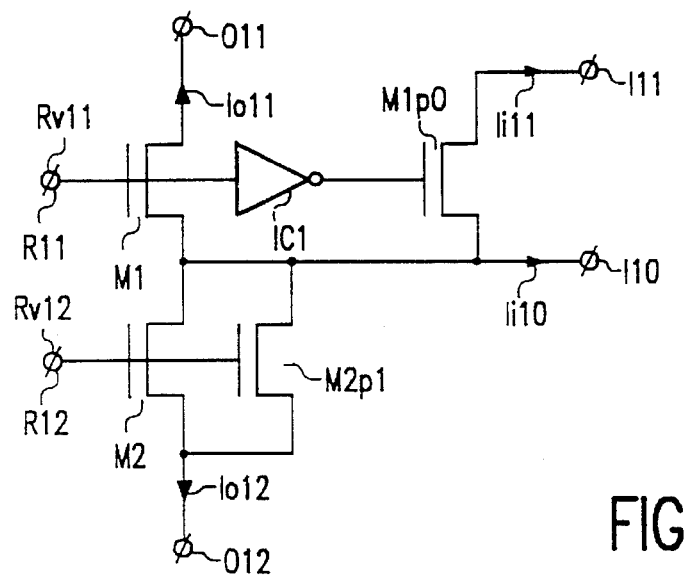
FIG. 10 shows a twelfth embodiment of a current divider in accordance with the invention.

FIG. 10 shows a twelfth embodiment of a current divider in accordance with the invention. The present embodiment differs from the current divider shown in FIG. 7A in that the present embodiment, similarly to the current divider shown in FIG. 5, comprises a further MOS transistor M2p1 having a control electrode and a main current path, the control electrode being coupled to the reference terminal R10 and the main current path being coupled parallel to the main current path of the MOS transistor M2. The present current divider is a third example of a combination of the current dividers shown in the preceding Figures, the signal current Ii10 being divided into the signal currents Io12 and Ii11 in a first active state of the current divider and the signal current Ii10 being divided into the signal currents Io12 and Io11 in a second active state of the current divider. As the present embodiment comprises the MOS transistor M2p1 a series arrangement of a plurality of current dividers of the present type results in a ladder network (a so-called R-2R network), in which ladder network in which the signal current Io12 is transferred with an attenuation of approximately six decibels relative to the signal current Ii10 in the first active state and in the second active state.

Figure 11:
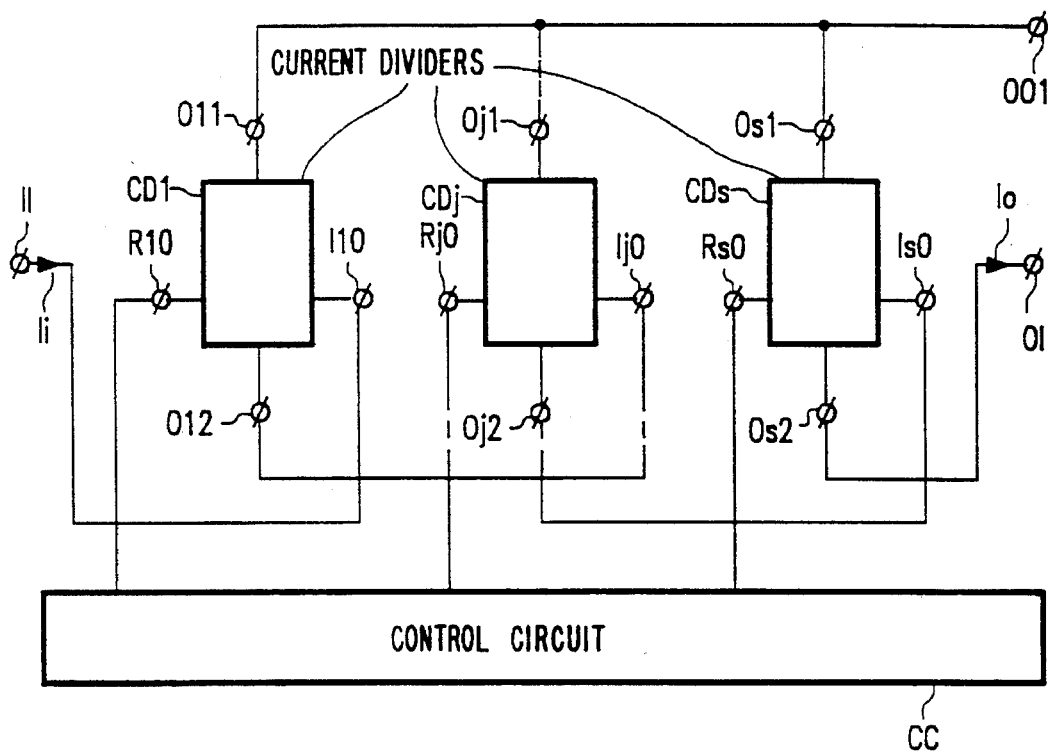
FIG. 11 shows a first embodiment of an integrated circuit comprising a plurality of current dividers in accordance with the invention.

FIG. 11 shows a first embodiment of an integrated circuit comprising a plurality of current dividers in accordance with the invention. In addition to three current dividers CD1, CDj and CDs the integrated circuit comprises an input terminal II for receiving an input current Ii, a first output terminal OI for supplying an output current Io, a second output terminal OO1 for supplying a second output current, and a control circuit CC for supplying the reference voltages required for the current dividers CD1, CDj and CDs. The current dividers CD1, CDj and CDs, similarly to the current dividers shown in FIGS. 1, 2, 3, 4 and 5, comprise a first terminal (I10, Ij0, Is0), a second terminal (O11, Oj1, Os1), a third terminal (O12, Oj2, Os2), and a reference terminal (R10, Rj0, Rs0), the respective first terminals (I10, Ij0, Is0) being used as input terminals. The first input terminal II is coupled to the terminal I10, the terminal O12 is coupled to the terminal Ij0, the terminal Oj2 is coupled to the terminal Is0, and the terminal Os2 is coupled to the output terminal OI, the respective terminals O11, Oj1 and Os1 being coupled to the output terminal OO1, and the respective reference terminals R10, Rj0 and Rs0 being coupled to the control circuit CC. Although the integrated circuit shown in FIG. 11 comprises only three current dividers, the number of current dividers in the integrated circuit is not limited to three but one or more further current dividers similar to the further current divider CDj may be coupled in series between the first current divider CD1 and the last current divider CDs. In the present circuit arrangement the input current Ii is successively divided by the respective current dividers, which current dividers are for example of the same construction as the current dividers shown in FIG. 1, 2, 3, 4 or 5, yielding a residual output current Io and the currents divided via the terminals O11, Oj1 and Os1 being available on the terminal OO1. By means of the reference voltages generated by the control circuit CC, which voltages are applied to the reference terminals R10, Rj0 and Rs0 and which are related to the first reference voltage Rv10, the total number of divided currents can be selected by setting one or more current dividers to a passive state, setting the current divider CDj to the passive state resulting in the current dividers CDj through Cds being set to their passive states. The control circuit CC can be constructed in various ways known to those skilled in the art, for example by means of some MOS transistors used as switches.

Figure 12:
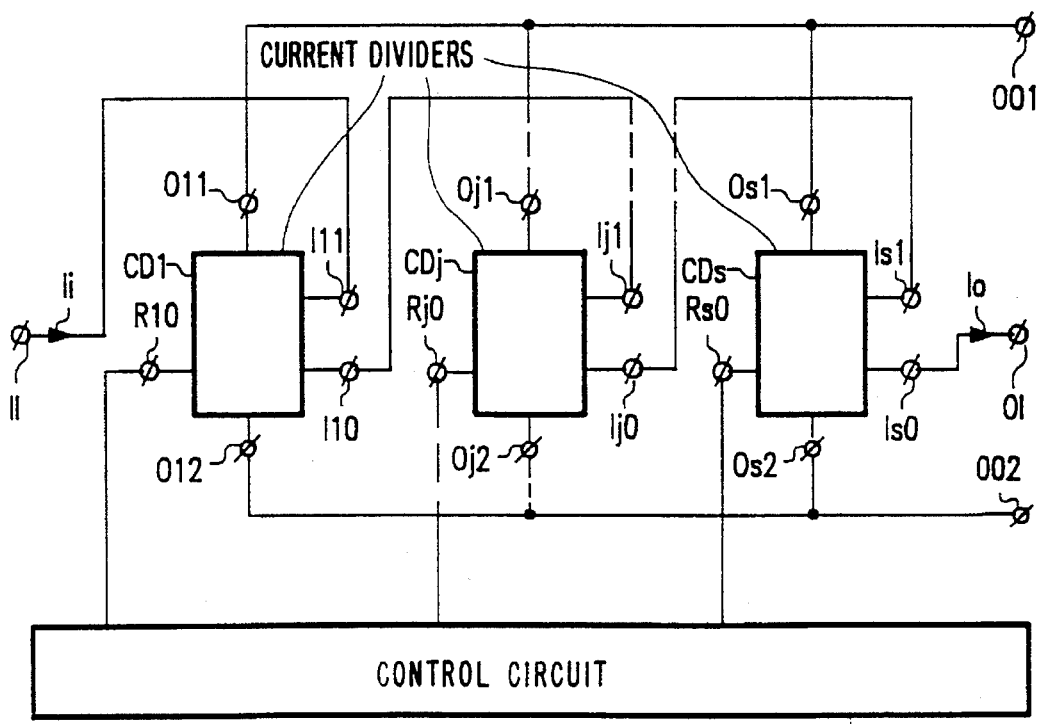
FIG. 12 shows a second embodiment of an integrated circuit comprising a plurality of current dividers in accordance with the invention.

FIG. 12 shows a second embodiment of an integrated circuit comprising a plurality of current dividers in accordance with the invention. In addition to three current dividers CD1, CDj and CDs the integrated circuit comprises an input terminal II for receiving an input current Ii, a first output terminal OI for supplying an output current Io, a second output terminal OO1 for supplying a second output current, a third output terminal for supplying a third output current, and a control circuit CC for supplying the reference voltages required for the current dividers CD1, CDj and CDs. The current dividers CD1, CDj and CDs, similarly to the current dividers shown in FIGS. 6A, 7A, 8, 9 and 10, comprise a first terminal (I10, Ij0, Is0), a second terminal (O11, Oj1, Os1), a third terminal (O12, Oj2, Os2), a fourth terminal (I11, Ij1, Is1) and a reference terminal (R10, Rj0, Rs0), the respective fourth terminals (I11, Ij1, Is1) being used as input terminals. The first input terminal II is coupled to the terminal I11, the terminal I10 is coupled to the terminal Ij1, the terminal Oj0 is coupled to the terminal Is1, and the terminal Is0 is coupled to the output terminal OI, the respective terminals O11, Oj1 and Os1 being coupled to the output terminal OO1, the respective terminals O12, Oj2 and Os2 being coupled to the output terminal OO2, and the respective reference terminals R10, Rj0 and Rs0 being coupled to the control circuit CC. Although the integrated circuit shown in FIG. 12 comprises only three current dividers, the number of current dividers in the integrated circuit is not limited to three but one or more further current dividers similar to the further current divider CDj may be coupled in series between the first current divider CD1 and the last current divider CDs. In the present circuit arrangement the input current Ii is successively divided by the respective current dividers, which current dividers are for example of the same construction as the current dividers shown in FIG. 6A, 8 or 9, yielding a residual output current Io, the currents divided via the terminals O11, Oj1 and Os1 being available on the terminal OO1, and the currents divided via the terminals O12, Oj2 and Os2 being available on the terminal OO2. By means of the reference voltages generated by the control circuit CC, which voltages are applied to the reference terminals R10, Rj0 and Rs0 and which are related to the first reference voltage Rv10, the total number of divided currents can be selected by setting one or more current dividers to a passive state, setting the current divider CDj to the passive state resulting in the current dividers CDj through Cds being set to their passive states. Thus, the present integrated circuit enables a controlled current division to be realised, which current division can be used for example for volume control, the input current being attenuated by setting a plurality of current dividers to their first active states.

Figure 13:
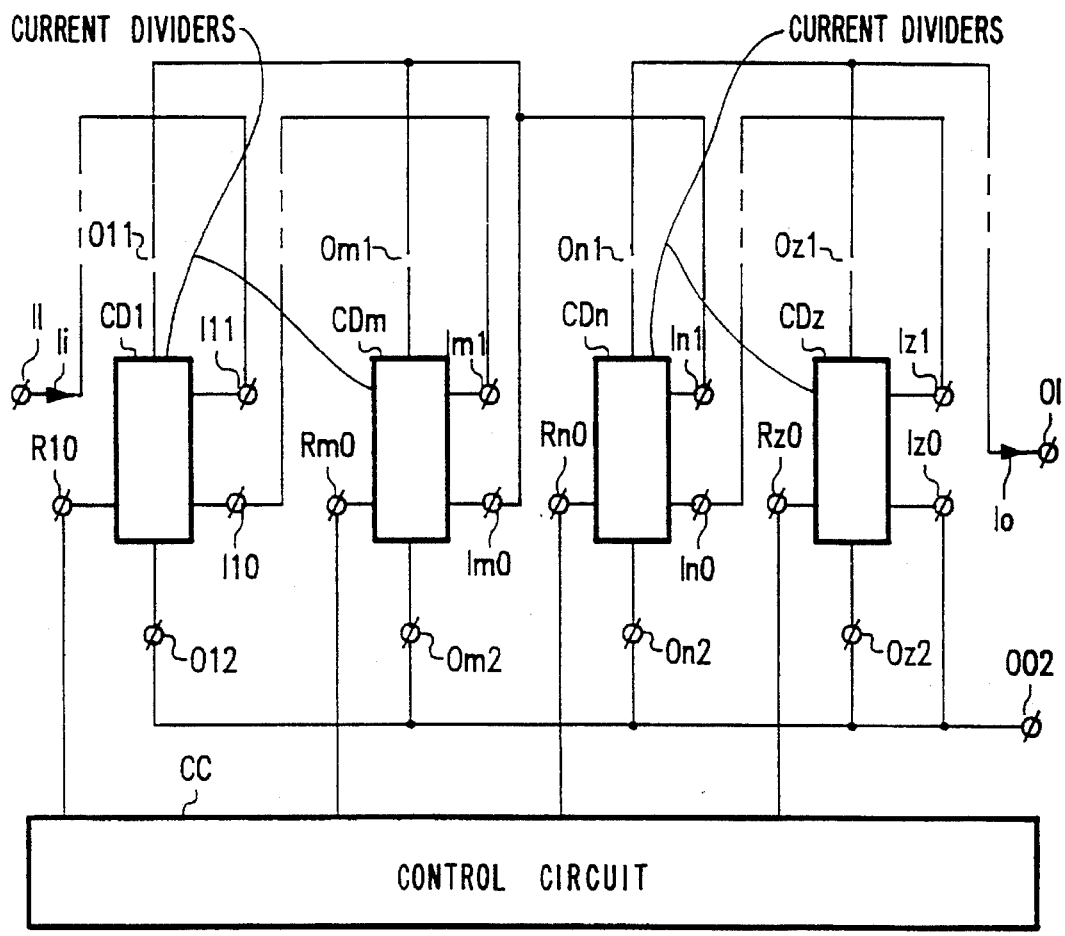
FIG. 13 shows a third embodiment of an integrated circuit comprising a plurality of current dividers in accordance with the invention.

FIG. 13 shows a third embodiment of an integrated circuit comprising a plurality of current dividers in accordance with the invention. The present embodiment comprises a first series arrangement of current dividers (CD1, CDm) having a first current dividing factor and a second series arrangement of current dividers (CDn, CDz) having a second current dividing factor. In addition to the first and the second series arrangement of current dividers (CD1, CDm, CDn and CDz) the integrated circuit comprises an input terminal II for receiving an input current Ii, a first output terminal OI for supplying an output current Io, a second output terminal OO2 for supplying a second output current, and a control circuit CC for supplying the reference voltages required for the current dividers CD1, CDm, CDn and CDz. Similarly to the current dividers shown in FIGS. 6A, 7A, 8, 9 and 10 the current dividers CD1, CDm, CDn and CDz shown in FIG. 13 comprise a first terminal (I10, Im0, In0, Iz0), a second terminal (O11, Om1, On1, Oz1), a third terminal (O12, Om2, On2, Oz2), a fourth terminal (I11, Im1, In1, Iz1), and a reference terminal (R10, Rm0, Rn0, Rz0), the respective fourth terminals (I11, Im1, In1, Iz1 ) being used as input terminals. The first series arrangement at comprises least a first current divider CD1 and a last current divider CDm and the second series arrangement of current dividers comprises at least a first current divider CDn and a last current divider CDz. In the first series arrangement the input terminal II is coupled to the terminal I11, the terminal I10 is coupled to the terminal Im1, the respective terminals O11 and Om1 are coupled to the terminal Im0, the respective terminals O12 and Om2 are coupled to the output terminal OO2, and the respective reference terminals R10 and Rm0 are coupled to the control circuit CC. In the second series arrangement the terminal In0 is coupled to the terminal Iz1, the terminal Iz0 is coupled to the output terminal OO2, the respective terminals On1 and Oz1 are coupled to the output terminal OI, the respective terminals On2 and Oz2 are coupled to the output terminal OO2, and the respective reference terminals Rn0 and Rz0 are coupled to the control circuit CC. The first and the second series arrangement are coupled to one another by means of the terminal Im0 and the terminal In1. Although the integrated circuit shown in FIG. 13 comprises only two current dividers in both the first and the second series arrangement the integrated circuit is not limited to the use of the current dividers shown and may include one or more further current dividers, corresponding to the further current divider CDj shown in FIG. 12, coupled in series between the first current divider CD1, CDn and the last current divider CDm, CDz. In the present circuit the input current Ii is successively divided by the respective current dividers (CD1, CDm) of the first series arrangement and by the respective current dividers (CDn, CDz) of the second series arrangement, which current dividers may for example be similar to the current dividers shown in FIG. 6A, 8 or 9, yielding the residual output current Io and the currents divided via the terminals O12, Om2, On2, Oz2 and Iz0 being available on the terminal OO2. By means of the reference voltages generated by the control circuit CC, which voltages are applied to the reference terminals R10, Rm0, Rn0 and Rz0 and which are related to the first reference voltage Rv10, the respective current dividers can be set individually to the first active state or to the passive state, an applied current being transferred in divided form in the first active state and an applied current being transferred in undivided form in the passive state. Thus, the present integrated circuit enables a controlled current division to be realised, which current division can be used for example for the purpose of volume control. When the current dividers in the first series arrangement are of a construction similar to the current divider shown in FIG. 8 and the current dividers in the second series arrangement are of a construction similar to the current divider shown in FIG. 9 the present circuit has the additional advantage that in the first series arrangement each current divider provides a coarse current dividing factor (twelve decibels) and that in the second series arrangement each current divider provides a fine current dividing factor (two decibels), so that a fine current division over a large range can be realised by means of a comparatively small number of current dividers.

Figure 14:
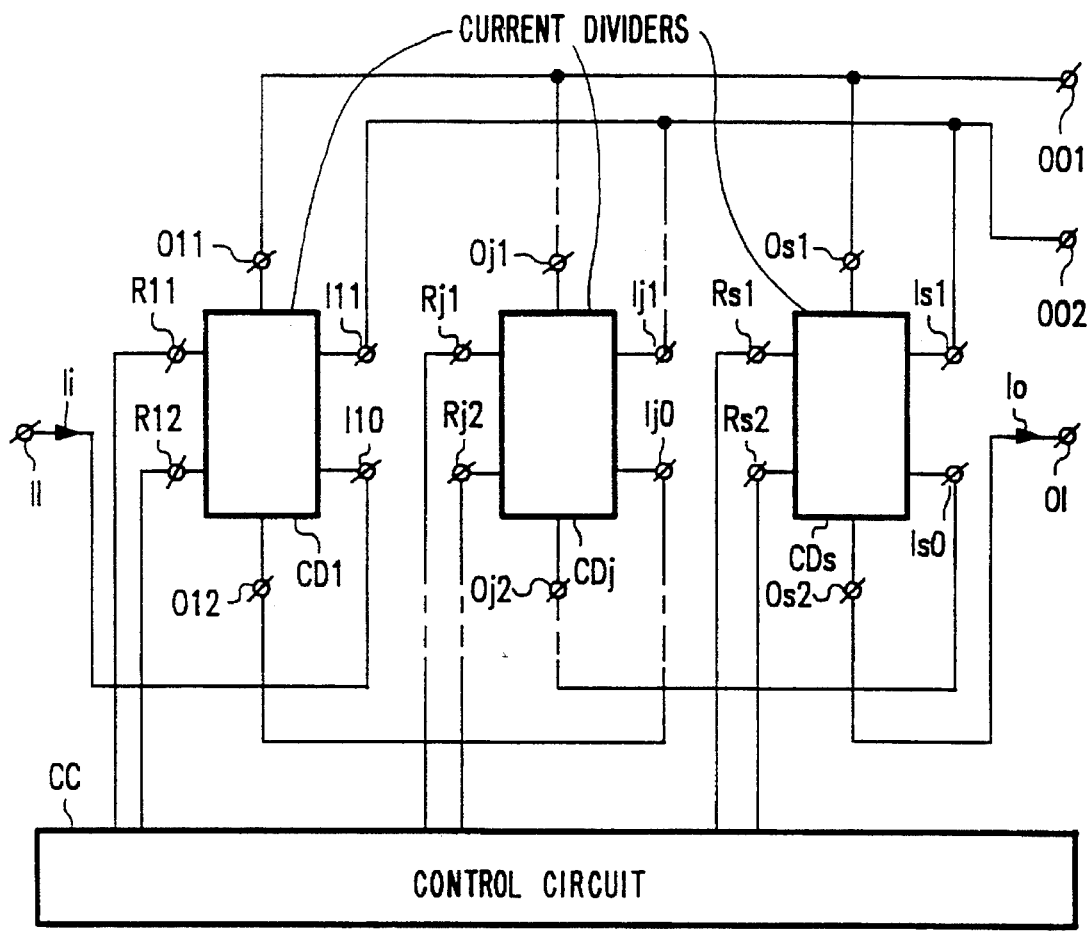
FIG. 14 shows a fourth embodiment of an integrated circuit comprising a plurality of current dividers in accordance with the invention.

FIG. 14 shows a fourth embodiment of an integrated circuit comprising a plurality of current dividers in accordance with the invention. In addition to three current dividers CD1, CDj, and CDs the integrated circuit comprises an input terminal II for receiving an input current Ii, a first output terminal OI for supplying an output current Io, a second output terminal OO1 for supplying a second output current, a third output terminal OO2 for supplying a third output current, and a control circuit CC for supplying the reference voltages required for the current dividers CD1, CDj, and CDs. Similarly to the current dividers shown in FIGS. 7A and 10 the current dividers CD1, CDj and CDs shown in FIG. 12 comprise a first terminal (I10, Ij0, Is0), a second terminal (O11, Oj1, Os1), a third terminal (O12, Oj2, Os2), a fourth terminal (I11, Ij1, Is1), a first reference terminal (R10, Rj1, Rs1), and a second reference terminal (R12, Rj2, Rs2), the respective first terminals (I10, Ij0, Is0) being used as input terminals. The input terminal II is coupled to the terminal I10, the terminal O12 is coupled to the terminal Ij0, the terminal Omj2 is coupled to the terminal Is0, the terminal Os2 is coupled to the output terminal OI, the respective terminals O11, Oj1 and Os1 are coupled to the output terminal OO1, the respective terminals I11, Ij1 and Is1 are coupled to the output terminal OO2, and the respective reference terminals R11, R12, Rj1, Rj2, Rs1 and Rs2 are coupled to the control circuit CC. Although the integrated circuit shown in FIG. 14 comprises only three current dividers the number of current dividers in the integrated circuit is not limited to three and the integrated circuit may include one or more further current dividers, corresponding to the further current divider CDj coupled in series between the first current divider CD1 and the last current divider CDs. In the present circuit the input current Ii is successively divided by the respective current dividers, which current dividers may for example be similar to the current dividers shown in FIG. 7A or 10, yielding the residual output current Io and the currents divided via the terminals O11, Oj1, and Os1 being available on the terminal OO1 and the currents divided via the terminals I11, Ij1, and Is1 being available on the terminal OO2. By means of the reference voltages generated by the control circuit CC, which voltages are applied to the reference terminals R11, Rj1, and Rs1 in a first modification of the first reference voltage Rv10 and to the reference terminals R12, Rj2, and Rs2 in a second modification of the first reference voltage Rv10, the respective current dividers can be set individually to the first active state and the second active state, an applied current being transferred in divided form to either the terminal OO1 or the terminal OO2. Thus, the present integrated circuit enables a controlled current division to be realised, which current division can be used for example for a digital-to-analog converter. In the digital-to-analog converter the controlled current division is effected on the basis of a digital signal applied to the control circuit CC, on the basis of which signal the first modification of the reference voltage RV10 is obtained, the second modification not being needed. The control circuit CC may be implemented for example by means of a shift register and some MOS transistors used as switches, the first modification of the reference voltage Rv10 being effected each time after a new word of the digital signal has been loaded. By means of the first modification of the reference signal Rv10 it is achieved that with each bit of a word of the digital signal a current divider corresponding to said bit is set to either the first active state or the second active state, so that both the current flowing via the output terminal OO1 and the current flowing via the output terminal OO2 form an analog representation of the digital signal. As in the present circuit only a current divider comprising four MOS transistors is required per bit it is possible to realise an eight-bit digital-to-analog converter by means of thirty-two MOS transistors, which converter can handle high frequencies (100 MHz) owing to the compactness of the circuit.

Figure 15:
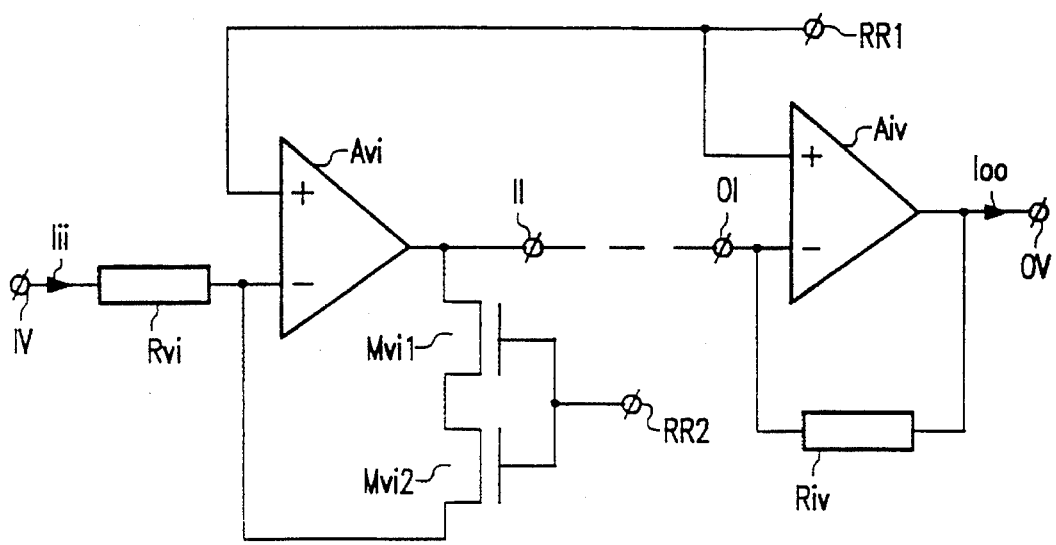
FIG. 15 shows a fifth embodiment of an integrated circuit comprising a plurality of current dividers in accordance with the invention, In these Figures like parts bear corresponding reference numerals.

FIG. 15 shows a fifth embodiment of an integrated circuit comprising a plurality of current dividers in accordance with the invention. The present embodiment, which comprises for example an arrangement of current dividers as shown in FIGS. 11, 12, 13 and 14, further comprises a voltage-to-current converter coupled between a further input terminal IV for receiving an input voltage, the input terminal II shown in said Figures, and a current-to-voltage converter coupled between the output terminal OI shown in said Figures and a further output terminal OV for supplying an output voltage, a further input current Iii flowing via the input terminal IV and a further output current Ioo flowing via the output terminal OV. The voltage-to-current converter comprises a resistive element Rvi, two MOS transistors Mvi1 and Mvi2 having a control electrode and a main current path, and an operational amplifier Avi having an inverting input, a non-inverting input, and an output. The inverting input is coupled to the input terminal II by means of the resistive element Rvi, the non-inverting input is coupled to a reference terminal RR1 for receiving a reference potential, and the output is coupled to the inverting input by means of the main current paths of the two MOS transistors Mvi1 and Mvi2 and to the input signal terminal I11, the control electrodes of the two MOS transistors being coupled to a reference terminal RR2 for receiving a reference potential. The current-to-voltage converter comprises a resistive element Riv and an operational amplifier Aiv having an inverting input, a non-inverting input and an output. The inverting input is coupled to the input terminal Is, the non-inverting input is coupled to the reference terminal RR1, and the output is coupled to the inverting input by means of the resistive element Riv and to the output terminal OO. As the above circuits each operate on the basis of a current FIG. 15 illustrates a method of effecting a voltage-to-current and a current-to-voltage conversion, the voltage-to-current conversion being effected in a special manner. Since the circuit comprises the MOS transistors Mvi1 and Mvi2 an current supplied by the operational amplifier Avi is linearly divided into an input current Ii flowing via the input terminal II and a current Iii flowing via the input terminal IV, which current Iii depends on the voltage applied to the terminal IV. As the current Iii is dictated by the voltage drop across the resistance Rvi the current supplied to the input terminal II by the operational amplifier and the input current Ii are determined by a feedback loop comprising the operational amplifier Avi and the MOS transistors Mvi1 and Mvi2. Consequently, a parasitic capacitance at the output of the operational amplifier Avi will not affect the input current Ii, enabling comparatively high frequencies to be processed with a comparatively low distortion, the current required for the parasitic capacitance being supplied by the operational amplifier Avi. Moreover, the circuit shown in FIG. 15 enables a controllable gain to be obtained, for example by scaling the resistive elements Rvi and Riv, or by means a ladder network coupled between the input terminals IV and II, which ladder network can produce a controllable gain, for example by means of a further control circuit.

The invention is not limited to the embodiments shown. Within the scope of the invention several modifications are conceivable to those skilled in the art. For example, many of the embodiments shown can be formed by means of different current dividers and the current dividers shown can be combined to form an integrated circuit in many of the ways shown herein. Moreover, it is to be noted that the MOS transistors of the current divider can be NMOS transistors and PMOS transistors.

We claim:

1. An integrated circuit comprising a plurality of at least two current dividers, each current divider dividing a first signal current (Ii10) into a second and a third signal current (Io11, Io12), said current divider comprising a first terminal (I10) for the passage of the first signal current (Ii10), a second terminal (O11) for the passage of the second signal current (Io11) and for receiving a first potential, a third terminal (O12) for the passage of the third signal current (Io12) and for receiving a second potential, a first MOS transistor (M1) having a control electrode and a main current path coupled between the first terminal (I10) and the second terminal (O11), and a second MOS transistor (M2) having a control electrode and a main current path coupled between the first terminal (I10) and the third terminal (O12), the control electrodes of the first and second MOS transistors (M1, M2) being coupled to a first reference terminal (R10) for receiving a first reference voltage (Rv10) to realize a conductive state of the main current path of the first MOS transistors (M1) and of the main current path of the second MOS transistor (M2) during a first active state of the current divider, characterized in that the current divider further comprises a fourth terminal (I11) for the passage of a fourth signal current (Ii11), an inverter circuit (Ic1), at least one further MOS transistor (M1s0) having a control electrode and a main current path, the control electrode being coupled to the first reference terminal (R10) by means of the inverter circuit (IC1) for receiving the first reference voltage (Rv10) to realize a cut-off state of the at least one further MOS transistor (M1s0) during the first active state of the current divider, and to realize a conductive state of the at least one further MOS transistor (M1s0) during a passive state of the current divider, the main current path of the at least one further MOS transistor (M1s0) being coupled between the main current path of the first MOS transistor (M1) and the second terminal (O11), and the fourth terminal (I11) being coupled to a point between the main current path of the first MOS transistor (MI) and the main current path of the at least one further MOS transistor (M1s0), and in that the integrated circuit further comprises an input terminal (II) for receiving an input current (Ii), and a first output terminal (OI) for supplying a first output current (Io), the input terminal (II) of the integrated circuit being coupled to a fourth terminal (I11) of a first current divider (CD1), a first terminal (I10) of the first current divider (CD1) being coupled to a fourth terminal (Is1) of a last current divider (CDs), and a first terminal (Is0) of the last current divider (CDs) being coupled to the first output terminal (OI) of the integrated circuit.

2. An integrated circuit as claimed in claim 1, characterized in that the integrated circuit further comprises a second output terminal (OO1) for supplying a second output current, respective second terminals (O11, Oj1, Os1) of the respective current dividers (CD1, CDj, CDs) being coupled to the second output terminal (OO1) of the integrated circuit.

3. An integrated circuit as claimed in claim 2, characterized in that the integrated circuit further comprises a third output terminal (OO2) for supplying a third output current, respective third terminals (O12, Oj2, Os2) of the respective current dividers (CD1, CDj, CDs) being coupled to the third output terminal (OO2) of the integrated circuit.

4. An integrated circuit as claimed in claim 1, characterized in that the integrated circuit further comprises a control circuit (CC), respective first reference terminals (R11, Rj1, Rs1) of the respective current dividers (CD1, CDj, CDs) being coupled to the control circuit (CC).

5. An integrated circuit comprising a plurality of at least two current dividers, each current divider dividing a first signal current (Ii10) into a second and a third signal current (Io11, Io12), said current divider comprising a first terminal (I10) for the passage of the first signal current (Ii10), a second terminal (O11) for the passage of the second signal current (Io11) and for receiving a first potential, a third terminal (O12) for the passage of the third signal current (Io12) and for receiving a second potential, a first MOS transistor (M1) having a control electrode and a main current path coupled between the first terminal (I10) and the second terminal (O11), and a second MOS transistor (M2) having a control electrode and a main current path coupled between the first terminal (I10) and the third terminal (O12), the control electrodes of the first and second MOS transistors (M1, M2) being coupled to a first reference terminal (R10) for receiving a first reference voltage (Rv10) to realize a conductive state of the main current path of the first MOS transistors (M1) and of the main current path of the second MOS transistor (M2) during a first active state of the current divider, characterized in that the current divider further comprises a fourth terminal (I11) for the passage of a fourth signal current (Ii11), an inverter circuit (Ic1), at least one further MOS transistor (M1s0) having a control electrode and a main current path, the control electrode being coupled to the first reference terminal (R10) by means of the inverter circuit (IC1) for receiving the first reference voltage (Rv10) to realize a cut-off state of the at least one further MOS transistor (M1s0) during the first active state of the current divider, and to realize a conductive state of the at least one further MOS transistor (M1s0) during a passive state of the current divider, the main current path of the at least one further MOS transistor (M1s0) being coupled between the main current path of the first MOS transistor (M1) and the second terminal (O11), and the fourth terminal (I11) being coupled to a point between the main current path of the first MOS transistor (MI) and the main current path of the at least one further MOS transistor (M1s0), and in that the integrated circuit further comprises an input terminal (II) for receiving an input current (Ii), and a first output terminal (OI) for supplying a first output current (Io), the input terminal (II) of the integrated circuit being coupled to a fourth terminal (I11) of a first current divider (CD1) of a first series arrangement of current dividers (CD1, CDm) having a first current dividing factor, a first terminal (I10) of the first current divider (CD1) of the first series arrangement of current dividers (CD1, CDm) being coupled to a fourth terminal (Im1) of a last current divider (CDm) of the first series arrangement of current dividers (CD1, CDm), respective second terminals (O11, Om1) of the respective current dividers (CD1, CDm) of the first series arrangement being coupled to a fourth terminal (In1) of a first current divider (CDn) of a second series arrangement of current dividers (CDn, CDz) having a second current dividing factor, a first terminal (In0) of the first current divider of the second series arrangement of current dividers (CDn, CDz) being coupled to a fourth terminal (Iz1) of a last current divider (CDz) of the second series arrangement of current dividers (CDn, CDz), and respective second terminals (On1, Oz1) of the respective current dividers (CDn, CDz) of the second series arrangement being coupled to the first output terminal of the integrated circuit.

6. An integrated circuit as claimed in claim 5, characterized in that the integrated circuit further comprises a second output terminal (OO2) for supplying a second output current, respective third terminals (O12, Om2, On2, Oz2) of the respective current dividers (CD1, CDm, CDn, CDz) being coupled to the second output terminal (OO2) of the integrated circuit, a first terminal (Im0) of the last current divider (CDm) of the first series arrangement of current dividers (CD1, CDm) being coupled to the fourth terminal (In1) of the first current divider (CDn) of the second series arrangement of current dividers (CDn, CDz), and a first terminal (Iz0) of the last current divider (CDz) of the second series arrangement of current dividers (CDn, CDz) being coupled to the second output terminal (OO2) of the integrated circuit.

7. An integrated circuit as claimed in claim 5, characterized in that the integrated circuit further comprises a control circuit (CC), respective first reference terminals (R10, Rm0, Rn0, Rz0) of the respective current dividers (CD1, CDm, CDn, CDz) being coupled to the control circuit (CC).

8. An integrated circuit comprising a plurality of at least two current dividers, each current divider dividing a first signal current (Ii10) into a second and a third signal current (Io11, Oo12), said current divider comprising a first terminal (I10) for the passage of the first signal current (Ii10), a second terminal (O11) for the passage of the second signal current (Io11) and for receiving a first potential, a third terminal (O12) for the passage of the third signal current (Io12) and for receiving a second potential, a first MOS transistor (M1) having a control electrode and a main current path coupled between the first terminal (I10) and the second terminal (O11), and a second MOS transistor (M2) having a control electrode and a main current path coupled between the first terminal (I10) and the third terminal (O12), the control electrodes of the first and second MOS transistors (M1, M2) being coupled to respective reference terminals for receiving respective reference voltages to realize a conductive state of the main current path of the first MOS transistor (M1) and of the main current path of the second MOS transistor (M2) during a first active state of the current divider, characterized in that the current divider further comprises a fourth terminal (I11) for the passage of a fourth signal current (Ii11), an inverter circuit (Ic1), and at least one further MOS transistor (M1p0) having a control electrode and a main current path, the control electrode being coupled to the control electrode of the first MOS transistor (M1) by means of the inverter circuit (IC1), the control electrode of the first MOS transistor (M1) being coupled to a first reference terminal (R11) for receiving a first reference voltage (Rv11), the control electrode of the second MOS transistor (M2) being coupled to a second reference terminal (R12) for receiving a second reference voltage (Rv12) to realize a cut-off state of the at least one further MOS transistor (M1p0) during the first active state of the current divider, and to realize a conductive state of the at least one further MOS transistor (M1p0) during a second active state of the current divider, the main current path of the at least one further MOS transistor (M1p0) being coupled between the first terminal (I10) and the fourth terminal (I11), and in that the integrated circuit further comprises an input terminal (II) for receiving an input current (Ii), and a first output terminal (OI) for supplying a first output current (Io), the input terminal (II) of the integrated circuit being coupled to a first terminal (I10) of the first current divider (CD1), a third terminal (O12) of the first current divider (CD1) being coupled to a first terminal (Is0) of the last current divider (CDs), and a third terminal of the last current divider (CDs) being coupled to the first output terminal (OI) of the integrated circuit.

9. An integrated circuit as claimed in claim 8, characterised in that the integrated circuit further comprises a second output terminal (OO1) for supplying a second output current, respective second terminals (O11, Oj1, Os1) of the respective current dividers (CD1, CDj, CDs) being coupled to the second output terminal (OO1) of the integrated circuit.

10. An integrated circuit as claimed in claim 9, characterized in that the integrated circuit further comprises a third output terminal (OO2) for supplying a third output current, respective fourth terminals (I11, Ij1, Is1) of the respective current dividers (CD1, CDj, CDs) being coupled to the third output terminal (OO2) of the integrated circuit.

11. An integrated circuit as claimed in claim 8, characterized in that the integrated circuit further comprises a control circuit (CC), respective first and second reference terminals (R11, R12, Rj1, Rj2, Rs1, Rs2) of the respective current dividers (CD1, CDj, CDs) being coupled to the control circuit (CC).

12. An integrated circuit as claimed in claim 1, characterized in that the integrated circuit further comprises a further input terminal (IV) for receiving an input voltage, a further output terminal (OV) for supplying an output voltage, a voltage-to-current converter, and a current-to-voltage converter, the voltage-to-current converter being coupled between the further integrated circuit and the input terminal (II) of the integrated circuit, and the current-to-voltage converter being coupled between the first output terminal (IO) of the integrated circuit and the further output terminal (OV) of the integrated circuit.

13. An integrated circuit as claimed in claim 12, characterized in that the integrated circuit further comprises a reference terminal (RR1) for receiving a reference voltage and a further reference terminal (RR2) for receiving a further reference voltage, and the voltage-to-current converter comprises a resistive element (Rvi), at least one MOS transistor (Mvi1, Mvi2) having a control electrode and a main current path, and an operational amplifier (Avi) having an inverting input, having a non-inverting input, and having an output, the inverting input being coupled to the further input terminal (VI) of the integrated circuit by means of the resistive element (Rvi), the non-inverting input being coupled to the first reference terminal (RR1), the output being coupled to the inverting input by means of the main current path of the at least one MOS transistor (Mvi1, Mvi2) and to a terminal (I11, I10) of the first current divider (CD1), and the control electrode of the at least one MOS transistor (Mvi1, Mvi2) being coupled to the second reference terminal (RR2) of the integrated circuit.

14. A current divider for dividing a first signal current (Ii10) into a second and a third signal current (Io11, Oo12), said current divider comprising a first terminal (I10) for the passage of the first signal current (Ii10), a second terminal (O11) for the passage of the second signal current (Io11) and for receiving a first potential, a third terminal (O12) for the passage of the third signal current (Io12) and for receiving a second potential, a first MOS transistor (M1) having a control electrode and a main current path coupled between the first terminal (I10) and the second terminal (O11), and a second MOS transistor (M2) having a control electrode and a main current path coupled between the first terminal (I10) and the third terminal (O12), the control electrodes of the first and second MOS transistors (M1, M2) being coupled to respective reference terminals for receiving respective reference voltages to realize a conductive state of the main current path of the first MOS transistor (M1) and of the main current path of the second MOS transistor (M2) during a first active state of the current divider, characterized in that the current divider further comprises a fourth terminal (I11) for the passage of a fourth signal current (Ii11), an inverter circuit (Ic1), and at least one further MOS transistor (M1p0) having a control electrode and a main current path, the control electrode being coupled to the control electrode of the first MOS transistor (M1) by means of the inverter circuit (IC1), the control electrode of the first MOS transistor (M1) being coupled to a first reference terminal (R11) for receiving a first reference voltage (Rv11), the control electrode of the second MOS transistor (M2) being coupled to a second reference terminal (R12) for receiving a second reference voltage (Rv12) to realize a cut-off state of the at least one further MOS transistor (M1p0) during the first active state of the current divider, and to realize a conductive state of the at least one further MOS transistor (M1p0) during a second active state of the current divider, the main current path of the at least one further MOS transistor (M1p0) being coupled between the first terminal (I10) and the fourth terminal (I11).

15. An integrated circuit as claimed in claim 1, characterized in that the integrated circuit further comprises a further current divider (CDj), and in that the first terminal (I10) of the first current divider (CD1) is coupled to the fourth terminal (Is1) of the last current divider (CDs) via the further current divider (CDj) by coupling the first terminal (I10) of the first current divider (CD1) to a fourth terminal (Ij1) of the further current divider (CDj) and by coupling a first terminal (Ij0) of the further current divider (CDj) to the fourth terminal (Is1) of the last current divider (CDs).

16. An integrated circuit as claimed in claim 15, characterized in that the integrated circuit further comprises a chain of additional current dividers, each additional current divider being similar to said first, last and further current dividers, a first terminal of a previous additional current divider being coupled to a fourth terminal of a next additional current divider in the chain.

17. An integrated circuit as claimed in claim 5, characterized in that the integrated circuit further comprises a further current divider, and in that the first terminal (I10, In) of the first current divider (CD1, CDn) is coupled to the fourth terminal (Im1, Iz1) of the last current divider (CDm, CDz) via the further current divider by coupling the first terminal (I10, In0) of the first current divider (CD1, CDn) to a fourth terminal of the further current divider and by coupling a first terminal of the further current divider to the fourth terminal (Im1, Iz1) of the last current divider (CDm, CDz).

18. An integrated circuit as claimed in claim 17, characterized in that the integrated circuit further comprises a chain of additional current dividers, each additional current divider being similar to said first, last and further current dividers, a first terminal of a previous additional current divider being coupled to a fourth terminal of a next additional current divider in the chain.

19. An integrated circuit as claimed in claim 8, characterized in that the integrated circuit further comprises a further current divider (CDj), and in that the third terminal (I12) of the first current divider (CD1) is coupled to the first terminal (Is0) of the last current divider (CDs) via the further current divider (CDj) by coupling the third terminal (I12) of the first current divider (CD1) to a first terminal (Ij0) of the further current divider (CDj) and by coupling a third terminal (Oj2) of the further current divider (CDj) to the first terminal (Is0) of the last current divider (CDs).

20. An integrated circuit as claimed in claim 19, characterized in that the integrated circuit further comprises a chain of additional current dividers, each additional current divider being similar to said first, last and further current dividers, a third terminal of a previous additional current divider being coupled to a first terminal of a next additional current divider in the chain.

* * * * *